(12) United States Patent
Antonyan

(10) Patent No.: US 9,711,203 B2
(45) Date of Patent: Jul. 18, 2017

(54) MEMORY DEVICE INCLUDING BOOSTED VOLTAGE GENERATOR

(71) Applicant: Samsung Electronics Co., Ltd., Suwon-si (KR)

(72) Inventor: Artur Antonyan, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/176,264

(22) Filed: Jun. 8, 2016

(65) Prior Publication Data

US 2017/0062035 A1 Mar. 2, 2017

(30) Foreign Application Priority Data

Aug. 27, 2015 (KR) .................. 10-2015-0120749

(51) Int. Cl.
G11C 11/16 (2006.01)

(52) U.S. Cl.
CPC .................. *G11C 11/1697* (2013.01)

(58) Field of Classification Search
CPC .................................. G11C 11/1697
USPC ........................................ 365/148
See application file for complete search history.

(56) References Cited

U.S. PATENT DOCUMENTS

| | | | |
|---|---|---|---|
| 5,367,489 A | 11/1994 | Park et al. | |
| 7,085,190 B2 | 8/2006 | Worley et al. | |
| 7,277,315 B2 | 10/2007 | Yuan et al. | |
| 7,636,254 B2 | 12/2009 | Ehrenreich et al. | |
| 7,791,961 B2 | 9/2010 | Kitazaki et al. | |
| 7,921,388 B2 | 4/2011 | Ehrenreich et al. | |
| 7,924,633 B2 | 4/2011 | Behrends et al. | |
| 7,956,673 B2 | 6/2011 | Pan | |
| 8,009,457 B2 | 8/2011 | Li et al. | |
| 8,493,812 B2 | 7/2013 | Dengler et al. | |
| 8,724,373 B2 | 5/2014 | Garg et al. | |
| 8,817,553 B2 | 8/2014 | Yu et al. | |

FOREIGN PATENT DOCUMENTS

JP 2012-164400 A 8/2012

*Primary Examiner* — Huan Hoang
*Assistant Examiner* — Muna A Techane
(74) *Attorney, Agent, or Firm* — Muir Patent Law, PLLC

(57) ABSTRACT

A boosted voltage generator may include a difference voltage generator, a first charging circuit, a second charging circuit and a switch circuit. The difference voltage generator generates a difference voltage to a first node, based on a reference voltage and a power supply voltage. The first charging circuit, connected between the first node and a ground voltage, charges the difference voltage therein during a first phase in response to a first pulse signal. The second charging circuit, connected between the first node and the ground voltage, charges the difference voltage therein during a second phase in response to a second pulse signal. The switch circuit, connected to a second node in the first charging circuit, a third node in the second charging circuit and an output node, provides a boosted voltage following a target level to the output node during each of the first phase and the second phase.

20 Claims, 27 Drawing Sheets

MEMORY DEVICE INCLUDING BOOSTED VOLTAGE GENERATOR

CROSS-REFERENCE TO RELATED APPLICATION(S)

This U.S. non-provisional application claims the benefit of priority under 35 USC §119 to Korean Patent Application No. 10-2015-0120749, filed on Aug. 27, 2015, in the Korean Intellectual Property Office, the contents of which are incorporated herein in their entirety by reference.

BACKGROUND

1. Technical Field

This disclosure relates to memory devices, and more particularly to a boosted voltage generator of a resistive type memory device, a voltage generator including the same and a resistive type memory device including the same

2. Discussion of the Related Art

With the development of semiconductor technology, the sizes of memory cells of memory devices including non-volatile memory device have been reduced and the density of the memory cells has been increased. With this increase in density and decrease of size the external power voltage, such as a power supply voltage has also decreased. Even when the power supply voltage is reduced, however, a voltage higher than the power supply voltage is typically supplied to circuits, bit lines, and word lines of a memory device. Accordingly, a high voltage generator generating a voltage higher than the power supply voltage is often used when the power supply voltage is considerably low.

SUMMARY

Some example embodiments may provide a boosted voltage generator, capable of generating a boosted voltage stably without employing a feedback path.

Some example embodiments may provide a voltage generator including the boosted voltage generator.

Some example embodiments may provide a resistive type memory device including the boosted voltage generator.

According to example embodiments, a boosted voltage generator of a resistive type memory device includes a difference voltage generator, a first charging circuit, a second charging circuit and a switch circuit. The difference voltage generator generates a difference voltage to a first node, based on a reference voltage and a power supply voltage. The first charging circuit is connected between the first node and a ground and charges the difference voltage therein during a first phase in response to a first pulse signal. The second charging circuit is connected between the first node and the ground, and charges the difference voltage therein during a second phase in response to a second pulse signal having an opposite phase as the first pulse signal. The switch circuit is connected to a second node in the first charging circuit, a third node in the second charging circuit and an output node. The switch circuit provides a boosted voltage following a target level to the output node during each of the first phase and the second phase.

In example embodiments, the difference voltage generator may include an operational amplifier, a first resistor and a second resistor. The operational amplifier may have a first input terminal, a second input terminal and an output terminal connected to the first node. The first resistor may be connected to the first input terminal. The second resistor may be connected to the first input terminal and the output terminal. The power supply voltage may be applied to the first input terminal through the first resistor and the reference voltage may be applied to the second input terminal.

A first resistance of the first resistor may be the same as a second resistance of the second resistor and the difference voltage may correspond to $2*VREF-VDDC$, where VREF denotes the reference voltage and VDDC denotes the power supply voltage.

In example embodiments, the first charging circuit may include a first n-channel metal-oxide semiconductor (NMOS) transistor, a metal-oxide semiconductor (MOS) capacitor, a p-channel metal-oxide semiconductor (PMOS) transistor and a second NMOS transistor. The first NMOS transistor may have a drain connected to the first node, a gate receiving the first pulse signal and a source connected to the second node. The MOS capacitor may have a gate connected to the second node and a source and a drain connected to each other. The PMOS transistor may have a source connected to the power supply voltage, a gate receiving the first pulse signal and a drain connected to a fourth node connected to the MOS capacitor. The second NMOS transistor may have a drain connected to the fourth node, a gate receiving the first pulse signal and a source connected to the ground voltage.

The first charging circuit may charge the difference voltage in the MOS capacitor by providing a current path from the first node to the ground voltage during the first phase when the first pulse signal has a first logic level. The first charging circuit may charge a voltage corresponding to $2*VREF$ (where VREF denotes the reference voltage) during the second phase when the first pulse signal has a second logic level opposite to the first logic level.

The switch circuit may provide a voltage of the second node to the output node as the boosted voltage during the second phase.

In example embodiments, the second charging circuit may include a first NMOS transistor, a MOS capacitor, a PMOS transistor and a second NMOS transistor. The first NMOS transistor may have a drain connected to the first node, a gate receiving the second pulse signal and a source connected to the third node. The MOS capacitor may have a gate connected to the third node and a source and a drain connected to each other. The PMOS transistor may have a source connected to the power supply voltage, a gate receiving the second pulse signal and a drain connected to a fifth node connected to the MOS capacitor. The second NMOS transistor may have a drain connected to the fifth node, a gate receiving the second pulse signal and a source connected to the ground voltage.

The second charging circuit may charge the difference voltage in the MOS capacitor by providing a current path from the second node to the ground voltage during the second phase when the second pulse signal has a first logic level. The second charging circuit may charge a voltage corresponding to $2*VREF$ (where VREF denotes the reference voltage) during the first phase when the second pulse signal has a second logic level opposite to the first logic level.

The switch circuit may provide a voltage of the third node to the output node as the boosted voltage during the first phase.

In example embodiments, the switch circuit may include a first PMOS transistor and a second PMOS transistor. The first PMOS transistor may have a source connected to the second node, a drain connected to the output node and a gate connected to the third node. The second PMOS transistor may have a source connected to the third node, a drain connected to the output node and a gate connected to the second node.

The switch circuit may provide a voltage of the third node to the output node as the boosted voltage through the second PMOS transistor during the first phase and the switch circuit may provide a voltage of the second node to the output node as the boosted voltage through the first PMOS transistor during the second phase.

In example embodiments, the boosted voltage generator may further include a MOS capacitor. The MOS capacitor may have a gate connected to the output node and a source and a drain connected to each other.

In example embodiments, the boosted voltage may converge to the target level from a voltage level lower than the target level as the first phase and the second phase are alternatingly repeated.

According to example embodiments, a voltage generator of a resistive type memory device includes a pulse generator, a reference voltage generator and a boosted voltage generator.

The pulse generator generates a first pulse signal and a second pulse signal based on a clock signal, and the first pulse signal and the second pulse signal having a phase difference of 180 degree with respect to each other. The reference voltage generator generates a reference voltage having a voltage level based on a trim signal. The boosted voltage generator generates a boosted voltage following a target level, based on the first pulse signal, the second pulse signal, the reference voltage and a power supply voltage. The boosted voltage generator includes a difference voltage generator, a first charging circuit, a second charging circuit and a switch circuit. The difference voltage generator generates a difference voltage to a first node, based on the reference voltage and the power supply voltage. The first charging circuit is connected between the first node and a ground voltage and charges the difference voltage therein during a first phase in response to the first pulse signal. The second charging circuit is connected between the first node and the ground voltage, and charges the difference voltage therein during a second phase in response to the second pulse signal. The switch circuit is connected to a second node in the first charging circuit, a third node in the second charging circuit and an output node. The switch circuit provides the boosted voltage to the output node during each of the first phase and the second phase.

In example embodiments, the difference voltage generator may output a voltage corresponding to 2*VREF−VDDC (where VREF denotes the reference voltage and the VDDC denotes the power supply voltage). The target level may correspond to 2*VREF. The trim signal may include a plurality of bits and the reference voltage generator may be configured to generate the reference voltage having a plurality of voltage levels according to bit values of the trim signal.

In example embodiments, the first charging circuit may charge the difference voltage in a first a metal-oxide semiconductor (MOS) capacitor therein by providing a first current path from the first node to the ground voltage during the first phase when the first pulse signal has a first logic level. The first charging circuit may charge a voltage corresponding to 2*VREF (where VREF denotes the reference voltage) during the second phase when the first pulse signal has a second logic level opposite to the first logic level.

The second charging circuit may charge the difference voltage to a second MOS capacitor therein by providing a second current path from the first node to the ground voltage during the second phase when the second pulse signal has the first logic level. The second charging circuit may charge a voltage corresponding to 2*VREF during the first phase when the second pulse signal has the second logic level.

According to example embodiments, a resistive type memory device includes a memory cell array, a voltage generator, a row decoder and a control logic circuit. The memory cell array includes a plurality of resistive type memory cells. The voltage generator generates word-line voltages based on control signals. The row decoder provides the word-line voltages to the memory cell array based on an address signal. The control logic circuit generates the control signals for controlling the voltage generator. The voltage generator includes a boosted voltage generator. The boosted voltage generator generates a boosted voltage following a target level based on a first pulse signal, a second pulse signal, a reference voltage and a power supply voltage. The word-line voltages include the boosted voltage. The row decoder provides the boosted voltage to a selected word-line of word-lines connected to the memory cell array.

In example embodiments, the boosted voltage generator may include a difference voltage generator, a first charging circuit, a second charging circuit and a switch circuit. The difference voltage generator generates a difference voltage to a first node, based on the reference voltage and the power supply voltage. The first charging circuit is connected between the first node and a ground voltage and charges the difference voltage therein during a first phase in response to the first pulse signal. The second charging circuit is connected between the first node and the ground voltage, and charges the difference voltage therein during a second phase in response to the second pulse signal. The switch circuit is connected to a second node in the first charging circuit, a third node in the second charging circuit and an output node. The switch circuit provides the boosted voltage to the output node during each of the first phase and the second phase. The memory cell array may include a plurality of memory blocks vertically formed on a substrate.

According to example embodiments, a boosted voltage generator includes a difference voltage generator configured to generate a first voltage at a first node based on a reference voltage, a first circuit including a first capacitor having a first end connected to a second node, the first circuit configured to charge the second node to the first voltage and boost the first voltage of the second node in response to a first pulse signal, a second circuit including a second capacitor having a first end connected to a third node, the second circuit configured to charge the third node to the first voltage and boost the first voltage of the third node in response to a second pulse signal having an opposite phase as the first pulse signal, and a switch circuit connected to the second node of the first circuit and the third node of the second circuit, the switch circuit configured to provide the boosted voltage to an output node.

Accordingly, the boosted voltage generator may generate a boosted voltage following a target level by using a fixed reference voltage without employing a feedback path. Therefore, the boosted voltage generator may operate stably and simplify circuit configuration.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
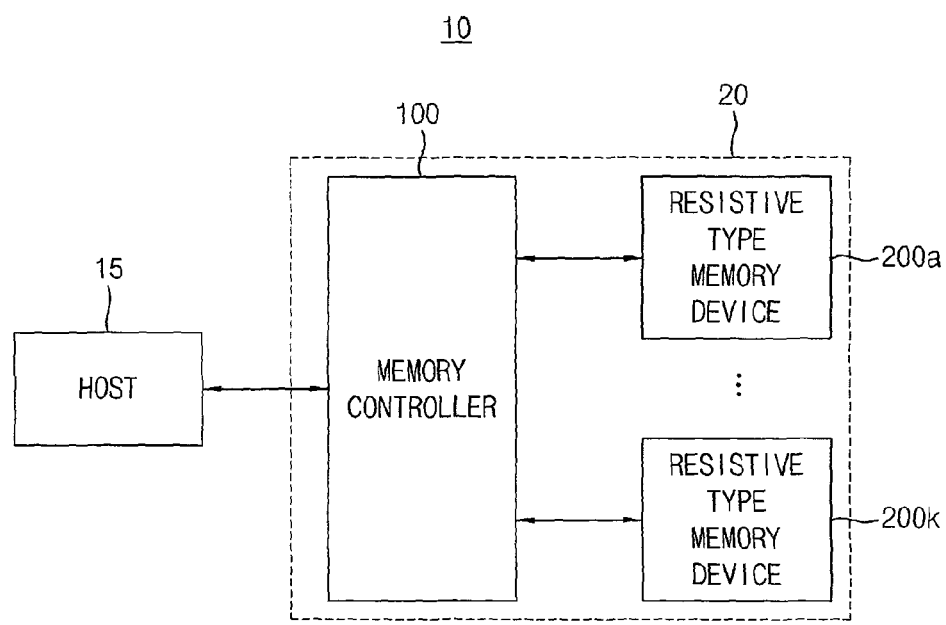
FIG. 1 is a block diagram illustrating an electronic system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are only used to distinguish one element from another, for example as a naming convention. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 15 and a memory system 20. The memory system 20 may include a memory controller 100 and a plurality of resistive type memory devices 200a~200k. Hereinafter, in example embodiments, the plurality of resistive type memory devices 200a~200k may alternatively be other types memory devices, for example, a dynamic random access memory (DRAM), a static random access memory (SRAM), an NAND flash memory, a NOR flash memory, a mobile DRAM, etc.

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of resistive type memory devices 200a~200k. For example, the memory controller 100 may write data in the plurality of resistive type memory devices 200a~200k or read data from the plurality of resistive type memory devices 200a~200k in response to request from the host 15.

In addition, the memory controller 100 may issue operation commands to the plurality of resistive type memory devices 200a~200k for controlling the plurality of resistive type memory devices 200a~200k.

In some embodiments, each of the plurality of resistive type memory devices 200a~200k may be a memory device including resistive type memory cells such as a magnetic random access memory (MRAM), a resistive random access memory (RRAM), a phase change random access memory (PRAM) and a ferroelectric random access memory (FRAM), etc.

An MRAM is a nonvolatile computer memory based on magnetoresistance. An MRAM is different from a volatile RAM in many aspects. Since an MRAM is nonvolatile, the MR.AM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance elements. In general, a magnetoresistance element is made of two magnetic layers each having magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (pinned layer) may be fixed and a magnetization direction of the other magnetic layer (free layer) may vary according to a magnetic field generated by a program current.

The magnetic field of the program current may arrange the magnetization directions of the two magnetic layers in parallel or anti-parallel. In one embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

An MRAM may be an all-round memory device that is low cost and has high capacity (like a dynamic random access memory (DRAM)), operates at high speed (like a static random access memory (SRAM)), and is nonvolatile (like a flash memory).

Figure 2:
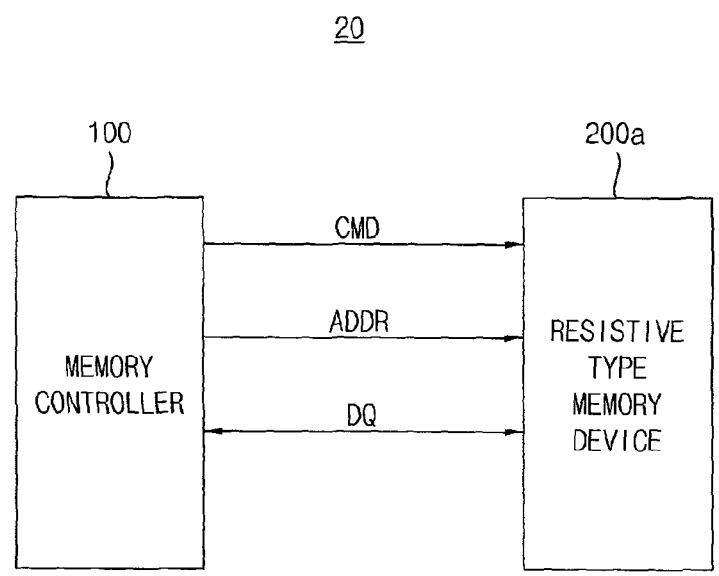
FIG. 2 is a block diagram illustrating an example of the memory system in FIG. 1 according to example embodiments.

FIG. 2 is a block diagram illustrating an example of the memory system in FIG. 1 according to example embodiments.

In FIG. 2, only one resistive type memory device 200a in communication with the memory controller 100 is illustrated for convenience. However, the details discussed herein related to resistive type memory device 200a may equally apply to the other resistive type memory devices 200b~200k.

Referring to FIG. 2, the memory system 20 may include the memory controller 100 and the resistive type memory device 200a. The memory controller 100 may transmit command CMD and address_ADDR to the resistive type memory device 200a. The memory controller 100 may exchange data DQ with the resistive type memory device 200a.

Referring to FIGS. 1 and 2, the memory controller 100 may input data to the resistive type memory device 200a or may output data from the resistive type memory device 200a based on the request from the host 15.

Figure 3:
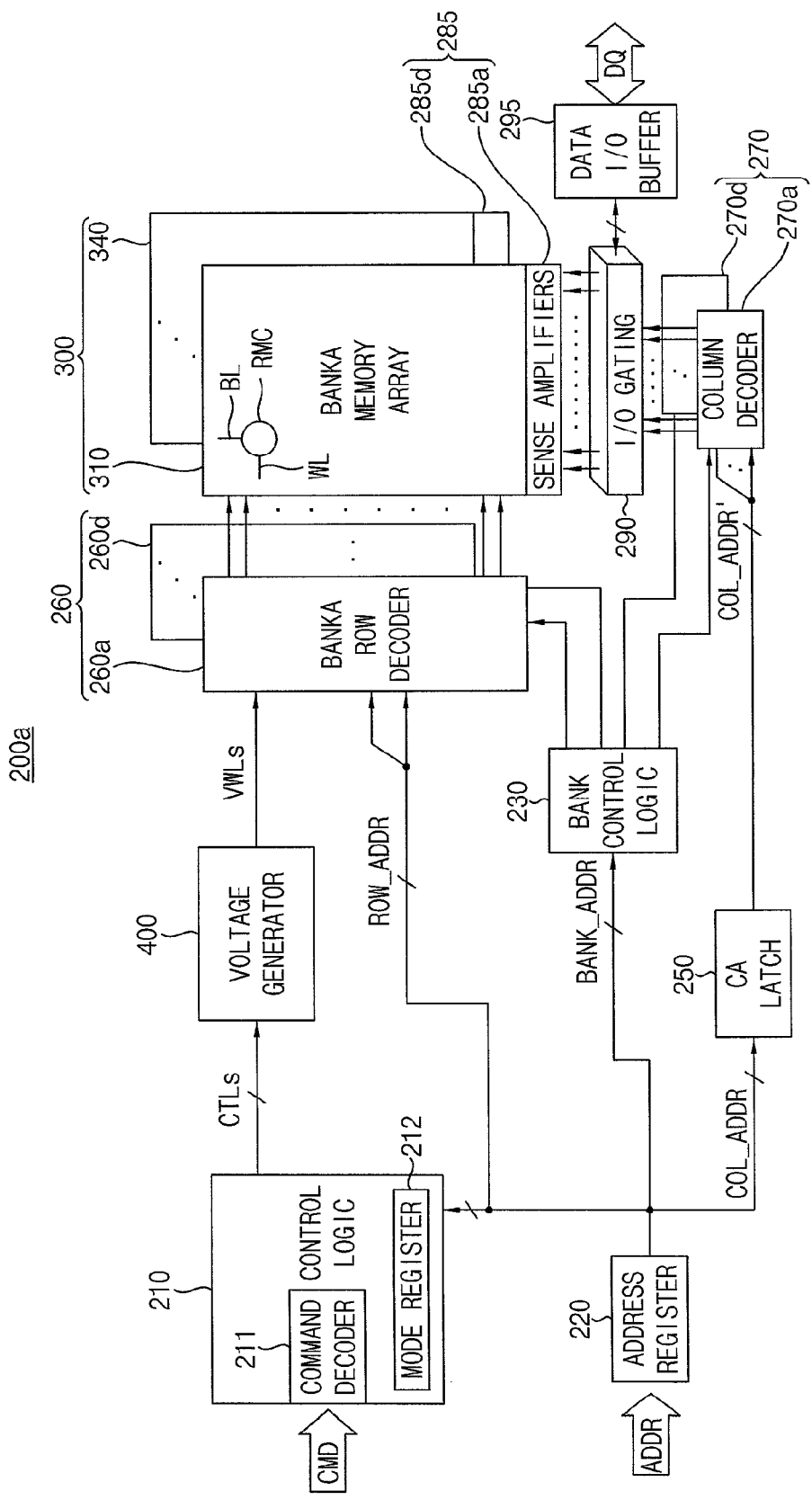
FIG. 3 is a block diagram illustrating an example of the resistive type memory device in FIG. 2 according to example embodiments.

FIG. 3 is a block diagram illustrating an example of the resistive type memory device in FIG. 2 according to example embodiments.

Referring to FIG. 3, the resistive type memory device 200a may include a control logic (or also referred to as a control logic circuit) 210, an address register 220, a bank control logic 230, a column address latch 250, a row decoder 260, a column decoder 270, a memory cell array 300, a sense amplifier unit 285, an input/output (I/O) gating circuit 290, a data input/output (I/O) buffer 295, and a voltage generator 400.

The memory cell array 300 may include first through eighth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. The first through fourth bank arrays 310~340, the first through fourth bank row decoders 260a~260d, the first through fourth bank column decoders 270a~270d and first through fourth bank sense amplifiers 285a~285d may form first through fourth banks. Each of the first through fourth bank arrays 310~340 may include a plurality of resistive type memory cells RMC, and each of resistive type memory cells RMC is coupled to a corresponding word-line and a corresponding bit-line. Although the resistive type memory device 200a is illustrated in FIG. 3 as including four banks, the resistive type memory device 200a may include any number of banks. In some embodiments, the different banks, as well as row and column decoders, may be formed on a single semiconductor chip (e.g., a die formed from a wafer). In other embodiments, each group of a different bank, row decoder, and column decoder (or different sets of groups) may be formed on a plurality of different respective semiconductor chips, such as a stack of semiconductor chips.

The address register 220 may receive an address_ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row decoder 260, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR' that is output from the column address latch 250, and may control the input/output gating circuit 290 in order to output data corresponding to the column address COL_ADDR'.

The I/O gating circuit 290 may include circuitry for gating input/output data. The I/O gating circuit 290 may further include read data latches for storing data that is output from the first through fourth bank arrays 310~340, and write drivers for writing data to the first through fourth bank arrays 310~340.

Data to be read from one bank array of the first through fourth bank arrays 310~340 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through fourth bank arrays 310~340 may be provided to the data I/O buffer 295 from the memory controller 100. The write driver may write the data DQ in one bank array of the first through fourth bank arrays 310~340.

The control logic 210 may control operations of the resistive type memory device 200a. For example, the control logic 210 may generate control signals for the resistive type memory device 200a in order to perform a write operation or a read operation. The control logic 210 may include, for example, a command decoder 211 that decodes a command CMD received from the memory controller 100 and a mode register 212 that sets an operation mode of the resistive type memory device 200a. The mode register 212 may be programmed by mode register set (MRS) commands. The mode register 212 may generate mode signals according to a programmed operation mode.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic 210 may provide control signals CTLs to the voltage generator 400 to control operation of the voltage generator 400 such that the voltage generator 400 provides word-line voltages VWLs to the row decoder 260.

The voltage generator 400 may generate the word-line voltages VWLs in response to the control signals CTLs and may provide the word-line voltages VWLs to the row decoder 260. The row decoder 260 may provide some of the word-line voltages VWLs to a selected word-line(s) to drive the selected word-line.

FIGS. 4A to 4D are circuit diagrams of examples of the resistive type memory cell in FIG. 3 according to example embodiments.

Figure 4A:
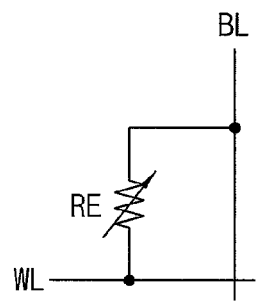
FIGS. 4A to 4D are circuit diagrams of examples of the resistive type memory cell in FIG. 3 according to example embodiments.
Figure 4B:
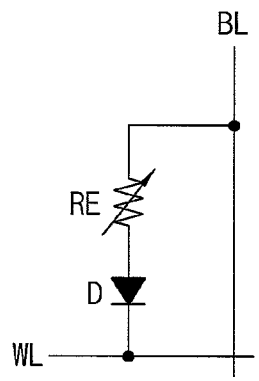
Figure 4C:
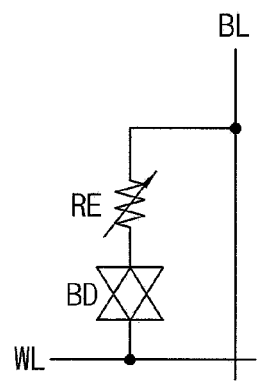
Figure 4D:
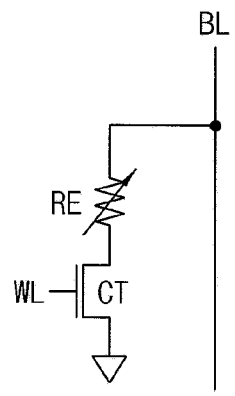

FIG. 4A shows a resistive type memory cell without a selection element, while FIGS. 4B to 4D show resistive type memory cells each comprising a selection element.

Referring to FIG. 4A, a resistive type memory cell RMC may include a resistive element RE connected to a bit-line BL and a word-line WL. Such a resistive type memory cell having a structure without a selection element may store data by a voltage applied between bit-line BL and word-line WL.

Referring to FIG. 4B, a resistive type memory cell RMC may include a resistive element RE and a diode D. Resistive element RE may include a resistive material for data storage. Diode D may include a selection element (or switching element) that supplies current to resistive element R or cuts off the current supply to resistive element R according to a bias of word-line WL and bit-line BL. Diode D may be coupled between resistive element RE and word-line WL, and resistive element RE may be coupled between bit-line BL and diode D.

Positions of diode D and resistive element RE may be interchangeable. Diode D may be turned on or turned off by a word-line voltage. Thus, a resistive memory cell may not be driven where a voltage of a constant level or higher is supplied to an unselected word-line WL.

Referring to FIG. 4C, a resistive type memory cell RMC may include a resistive element RE and a bidirectional diode BD. Resistive element RE may include a resistive material for data storage. Bidirectional diode BD may be coupled between resistive element RE and a word-line WL, and resistive element RE may be coupled between a bit-line BL and bidirectional diode BD. Positions of bidirectional diode BD and resistive element RE may be interchangeable. Bidirectional diode BD may block leakage current flowing to an unselected resistive type memory cell.

Referring to FIG. 4D, a resistive type memory cell RMC may include a resistive element RE and a transistor CT. Transistor CT may be a selection element (or switching element) that supplies current to resistive element RE or cuts off the current supply to resistive element RE according to a voltage of a word-line WL. Transistor CT may be coupled between resistive element RE and a word-line, and resistive element RE may be coupled between a bit-line BL and transistor CT. Positions of transistor CT and resistive element RE may be interchangeable. The resistive type memory cell may be selected or unselected depending on whether transistor CT driven by word-line WL is turned on or turned off.

Figure 5:
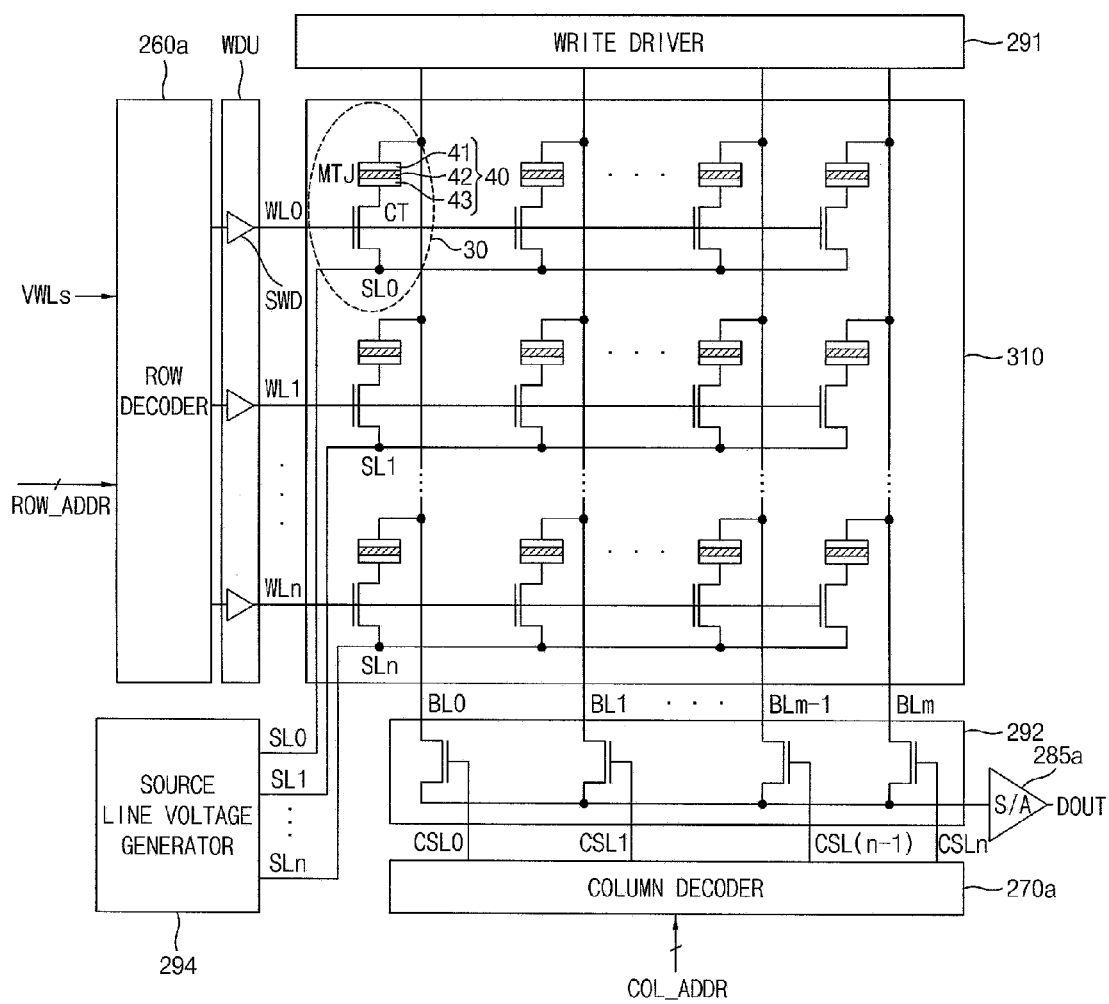
FIG. 5 illustrates an example of the first bank array in the resistive type memory device of FIG. 3 according to example embodiments.

FIG. 5 illustrates an example of the first bank array in the resistive type memory device of FIG. 3 according to example embodiments.

Referring to FIG. 5, the first bank array 310 may include a plurality of word-lines WL0 through WLn (where n is a natural number equal to or greater than 1), a plurality of bit-lines BL0 through BLm (where M is a natural number equal to or greater than 1), a plurality of source lines SL0 through SLn, and a plurality of resistive type memory cells 30 disposed at intersections between the word-lines WL0 through WLn and the bit-lines BL0 through BLm. Each of the resistive type memory cells 30 may be an STT-MRAM cell. The resistive type memory cell 30 may include an MTJ element 40 having a magnetic material.

Each of the resistive memory cells 30 may include a cell transistor CT and the MTJ element 40. In one memory cell 30, a drain (a first electrode) of the cell transistor CT may be connected to a pinned layer 43 of the MTJ element 40. A free layer 41 of the MTJ 40 may be connected to the bit-line BL0, and a source (a second electrode) of the cell transistor CT may be connected to the source line SL0. A gate of the cell transistor CT may be connected to the word line WL0.

The MTJ element 40 may be replaced by a resistive device such as a phase change random access memory (PRAM) using a phase change material, a resistive random access memory (RRAM) using a variable resistive material such as a complex metal oxide, or a magnetic random access memory (MRAM) using a ferromagnetic material. Materials forming the resistive devices have resistance values that vary according to a size and/or a direction of a current or a voltage, and are nonvolatile and thus may maintain the resistance values even when the current or the voltage is cut off.

The word-line WL0 may be enabled by a row decoder 260a, and may be connected to a word line driver unit WDU that drives a word-line selection voltage. The word-line selection voltage activates the word-line WL0 in order to read or write a logic state of the MTJ element 40 through a sub word-line driver SWD.

The source line SL0 is connected to a source line voltage generator 294. The source line voltage generator 294 may receive and decode an address signal and a read/write signal, and may generate a source line selection signal in the selected source line SL0. A ground reference voltage may be supplied to the unselected source lines SL1 through SLn.

The bit-line BL0 is connected to a column select circuit 292 that is driven by column selection signals CSL0 through CSLm. The column selection signals CSL0 through CSLm are selected by a column decoder 270a based on the column address COL_ADDR. For example, the selected column selection signal CSL0 turns on a column select transistor in the column selection circuit 292, and selects the bit-line BL0. A logic state of the MTJ element 40 is read from the bit-line BL0 through a sense amplifier 285a. Alternatively, a write current applied through the write driver 291 is transmitted to the selected bit-line BL0 and is written to the MTJ element 40.

Figure 6:
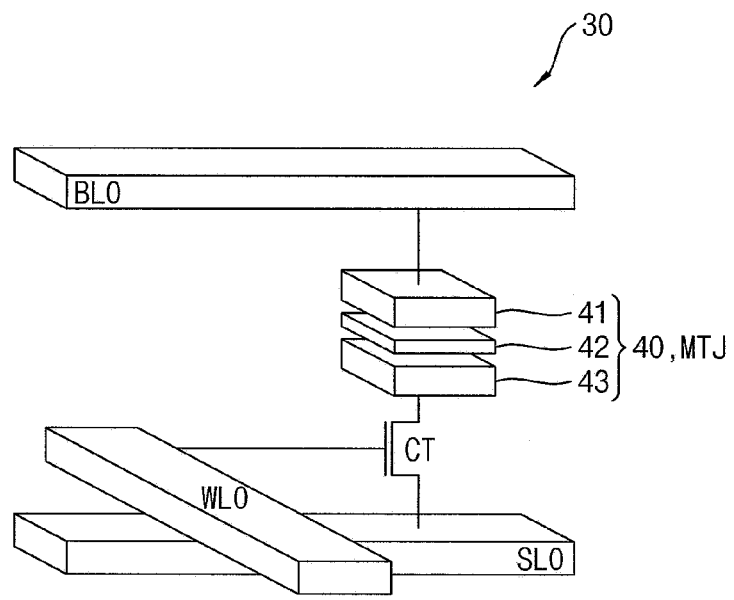
FIG. 6 is a stereogram illustrating the resistive type memory cell (referred to as STT-MRAM cell) in FIG. 5 according to example embodiments.

FIG. 6 is a stereogram illustrating the resistive type memory cell (referred to as STT-MRAM cell) in FIG. 5 according to example embodiments.

Referring to FIG. 6, the STT-MRAM cell 30 may include the MTJ element 40 and the cell transistor CT. A gate of the cell transistor CT is connected to a word-line (for example, the word-line WL0), and one electrode of the cell transistor CT is connected through the MTJ 40 to a bit-line (for example, the bit-line BL0). Also, the other electrode of the cell transistor CT is connected to a source line (for example, the source line SL0).

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL0 to turn on the cell transistor CT. A program current, that is, a write current is applied to the bit-line BL0 and the source line SL0. A direction of the write current is determined by a logic state of the MTJ element 40.

In order to perform a read operation of the STT-MRAM cell 30, a high voltage is applied to the word-line WL0 to turn on the cell transistor CT, and a read current is supplied to the bit-line BL0 and the source line SL0. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 7A:
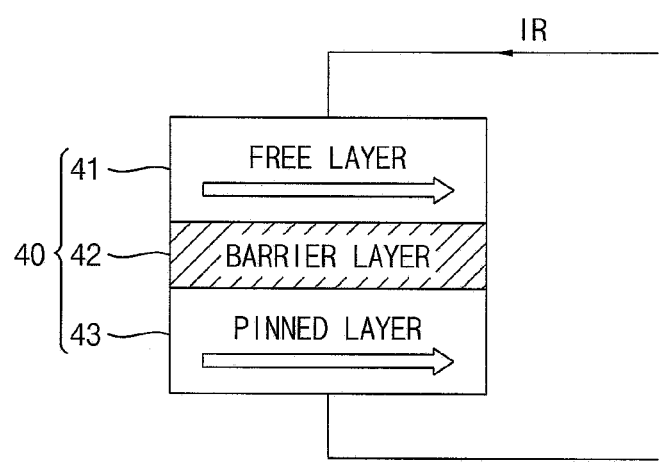
FIGS. 7A and 7B are block diagrams for explaining a magnetization direction according to data written to the MTJ element of FIG. 6.
Figure 7B:
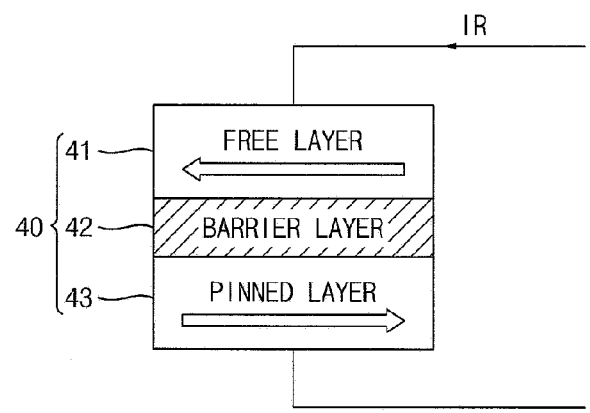

FIGS. 7A and 7B are block diagrams for explaining a magnetization direction according to data written to the MTJ element of FIG. 6.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 7A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 7B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ 40 are horizontal magnetic layers, the present disclosure is not limited thereto and the free layer 41 and the pinned layer 43 may be, for example, vertical magnetic layers.

Figure 8:
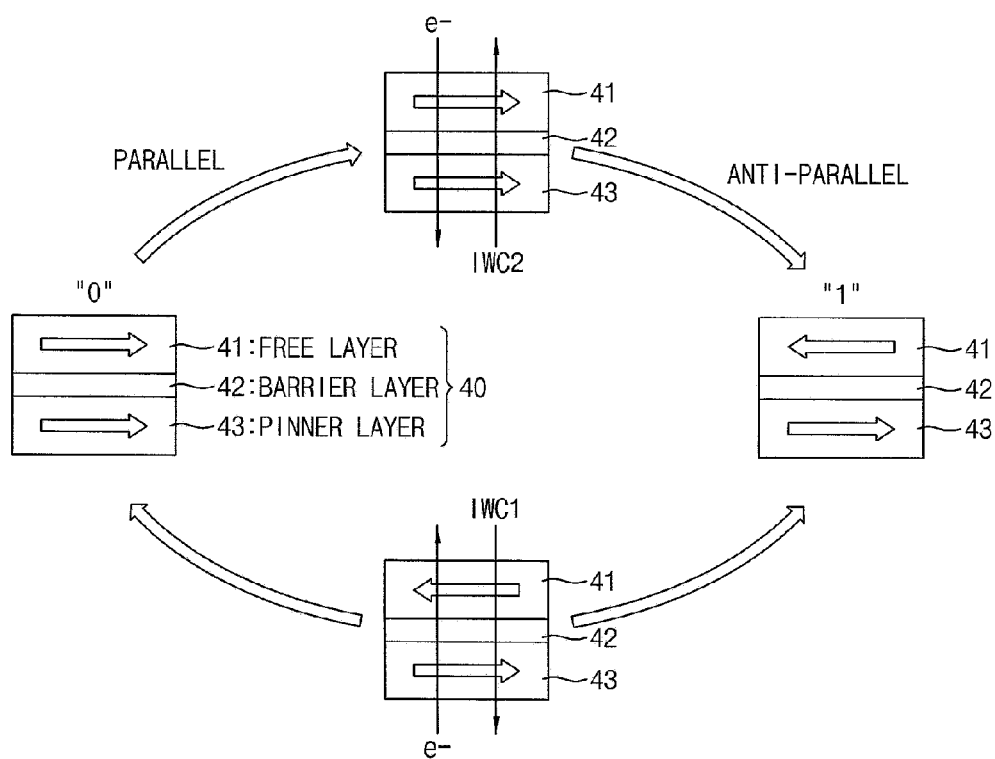
FIG. 8 is a block diagram for explaining a write operation of the STT-MRAM cell of FIG. 6 according to example embodiments.

FIG. 8 is a block diagram for explaining a write operation of the STT-MRAM cell of FIG. 6 according to example embodiments.

Referring to FIG. 8, a magnetization direction of the free layer 41 may be determined based on a direction of a write current IW flowing through the MTJ 40. For example, when a first write current IWC1 is supplied from the free layer 41 to the pinned layer 43, free electrons having the same spin direction as that of the pinned layer 43 apply a torque to the free layer 41.

Accordingly, the free layer 41 may be magnetized parallel to the pinned layer 43.

When a second write current IWC2 is applied from the pinned layer 43 to the free layer 41, electrons having a spin direction opposite to that of the pinned layer 41 return to the free layer 43 and apply a torque. Accordingly, the free layer 41 may be magnetized anti-parallel to the pinned layer 43. That is, a magnetization direction of the free layer 41 of the MTJ 40 may be changed by an STT.

Figure 9A:
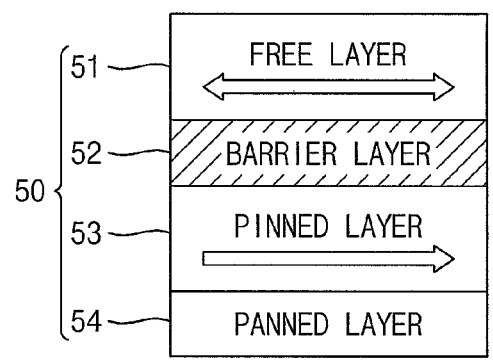
FIGS. 9A and 9B are block diagrams illustrating MTJs in the STT-MRAM cell in FIG. 6 according to example embodiments.
Figure 9B:
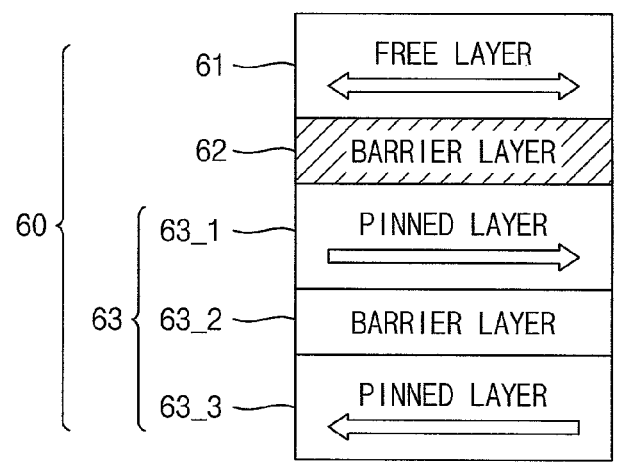

FIGS. 9A and 9B are block diagrams illustrating MTJs in the STT-MRAM cell in FIG. 6 according to example embodiments.

Referring to FIG. 9A, the MTJ 50 may include a free layer 51, a tunnel layer 52, a pinned layer 53, and an anti-ferromagnetic layer 54. The free layer 51 may include a material having a variable magnetization direction. A magnetization direction of the free layer 51 may vary according to electrical/magnetic factors provided outside and/or inside of a memory cell. The free layer 51 may include a ferromagnetic material including, for example, at least one of cobalt (Co), iron (Fe), and nickel (Ni). For example, the free layer 51 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$.

The tunnel layer 52, also referred to as a barrier layer 52, may have a thickness less than a spin diffusion distance. The tunnel layer 52 may include a non-magnetic material. For example, the tunnel layer 52 may include at least one selected from the group consisting of magnesium (Mg), titanium (Ti), aluminum (Al), a magnesium-zinc (MgZn) oxide, a magnesium-boron (MgB) oxide, a Ti nitride, and a vanadium (V) nitride.

The pinned layer 53 may have a magnetization direction fixed by the anti-ferromagnetic layer 54. Also, the pinned layer 53 may include a ferromagnetic material. For example, the pinned layer 53 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$.

The anti-ferromagnetic layer 54 may include an anti-ferromagnetic material. For example, the anti-ferromagnetic layer 54 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

Since each of the free layer 51 and the pinned layer 53 of the MTJ element 50 may be formed of a ferromagnetic material, a stray field may be generated at an edge of the ferromagnetic material. The stray field may reduce magnetoresistance or increase resistive magnetism of the free layer 51. In addition, the stray field may affect switching characteristics, thereby resulting in asymmetric switching. Accordingly, a structure for reducing or controlling a stray field generated at the ferromagnetic material in the MTJ element 50 may be used.

Referring to FIG. 9B, a pinned layer 63 of the MTJ element 60 may be formed of a synthetic anti-ferromagnetic (SAF) material. The pinned layer 63 may include a first ferromagnetic layer 63_1, a coupling layer 63_2, and a second ferromagnetic layer 63_3. Each of the first and second ferromagnetic layers 63_1 and 63_3 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$. In this case, a magnetization direction of the first ferromagnetic layer 63_1 and a magnetization direction of the second ferromagnetic layer 63_3 are different from each other, and are fixed. The coupling layer 63_2 may include ruthenium (Ru), for example.

Figure 10:
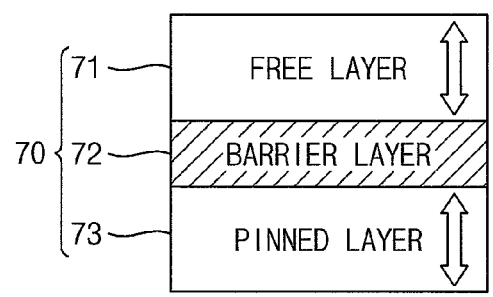
FIG. 10 is a block diagram illustrating an MTJ element in the STT-MRAM cell in FIG. 6 according to example embodiments.

FIG. 10 is a block diagram illustrating an MTJ element in the STT-MRAM cell in FIG. 6 according to example embodiments.

Referring to FIG. 10, a magnetization direction of the MTJ element 70 is vertical and a moving direction of a current and a magnetization easy-axis are substantially parallel to each other. The MTJ element 70 includes a free layer 71, a tunnel layer 72, and a pinned layer 73. A resistance value is small when a magnetization direction of the free layer 71 and a magnetization direction of the pinned layer 73 are parallel to each other, and, is large when a magnetization direction of the free layer 71 and a magnetization direction of the pinned layer 73 are anti-parallel to each other. Data may be stored in the MTJ element 70 according to the resistance value.

In order to realize the MTJ element 70 having a vertical magnetization direction, each of the free layer 71 and the pinned layer 73 may be formed of a material having high magnetic anisotropy energy. Examples of the material having high magnetic anisotropy energy include an amorphous rare earth element alloy, a multi-layer thin film such as (Co/Pt)n or (Fe/Pt)n, and an ordered lattice material having an L10 crystal structure. For example, the free layer 71 may be formed of an ordered alloy, and may include at least one selected from the group consisting of Fe, Co, Ni, palladium (Pa), and platinum (Pt). Alternatively, the free layer 71 may include at least one selected from the group consisting of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Such alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

The pinned layer 73 may be formed of an ordered alloy, and may include at least one selected from the group consisting of Fe, Co, Ni, Pa, and Pt. For example, the pinned layer 73 may include at least one selected from the group consisting of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Such alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

Figure 11A:
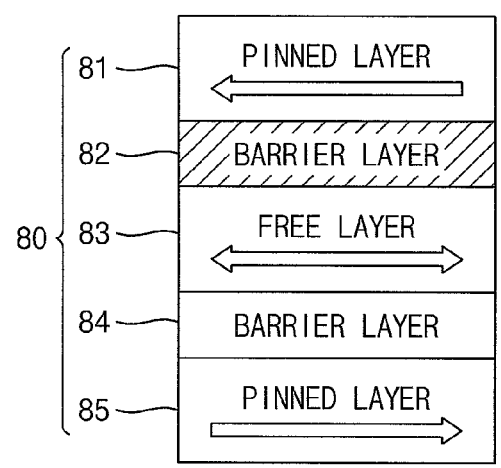
FIGS. 11A and 11B are block diagrams illustrating dual MTJs in the STT-MRAM cell in FIG. 6 according to example embodiments.
Figure 11B:
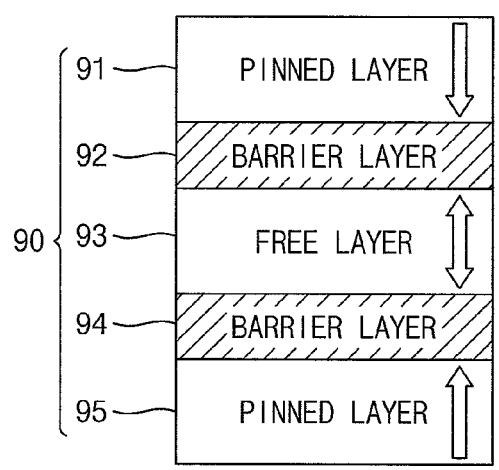

FIGS. 11A and 11B are block diagrams illustrating dual MTJs in the STT-MRAM cell in FIG. 6 according to example embodiments.

A dual MTJ is configured such that a tunnel layer and a pinned layer are disposed at both ends of a free layer.

Referring to FIG. 11A, the dual MTJ element 80 having a horizontal magnetization direction may include a first pinned layer 81, a first tunnel layer 82, a free layer 83, a second tunnel layer 84, and a second pinned layer 85. Materials of the first and second pinned layers 81 and 85 are similar to that of the pinned material 53 of FIG. 9A, materials of the first and second tunnel layers 82 and 84 are similar to that of the tunnel layer 52 of FIG. 9A, and a material of the free layer 83 is similar to that of the free layer 51 of FIG. 7A.

When a magnetization direction of the first pinned layer 81 and a magnetization direction of the second pinned layer 85 are fixed to opposite directions, magnetic forces by the first and second pinned layers 81 and 85 substantially counterbalance. Accordingly, the dual MTJ element 80 may perform a write operation by using a smaller current than a general MTJ element.

Since the dual MTJ element 80 provides a higher resistance during a read operation due to the second tunnel layer 84, an accurate data value may be obtained.

Referring to FIG. 11B, the dual MTJ element 90 having a vertical magnetization direction includes a first pinned layer 91, a first tunnel layer 92, a free layer 93, a second tunnel layer 94, and a second pinned layer 95. Materials of the first and second pinned layers 91 and 95 are similar to that of the pinned layer 73 of FIG. 10, materials of the first and second tunnel layers 92 and 94 are similar to that of the tunnel layer 72 of FIG. 10, and a material of the free layer 93 is similar to that of the free layer 71 of FIG. 10.

In this case, when a magnetization direction of the first pinned layer 91 and a magnetization direction of the second pinned layer 95 are fixed to opposite directions, magnetic forces by the first and second pinned layers 91 and 95 substantially counterbalance. Accordingly, the dual MTJ element 90 may perform a write operation by using a smaller current than a general MTJ element.

Figure 12:
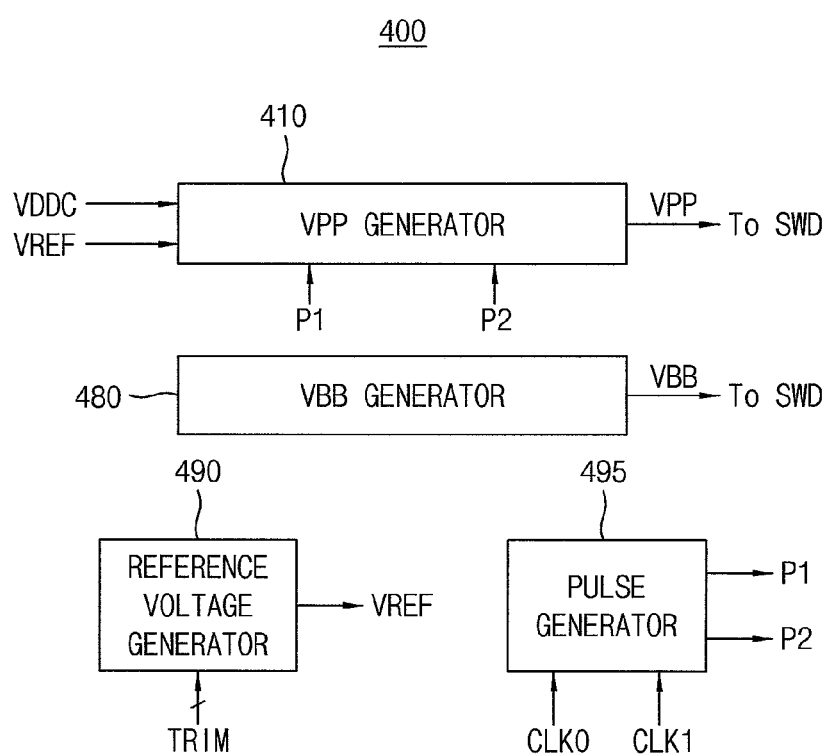
FIG. 12 is a block diagram illustrating the voltage generator in the resistive type memory device of FIG. 3 according to example embodiments.

FIG. 12 is a block diagram illustrating the voltage generator in the resistive type memory device of FIG. 3 according to example embodiments.

Referring to FIG. 12, the voltage generator 400 may include a boosted voltage generator 410, a negative voltage generator 480, a reference voltage generator 490 and a pulse generator 495.

The pulse generator 495 may generate a first pulse signal P1 and a second pulse signal P2 based on at least one of clock signals CLK0 and CLK1. The first pulse signal P1 and the second pulse signal P2 may have a phase difference of 180 degree with respect to each other.

The reference voltage generator 490 may generate a reference voltage VREF having a level based on a trim signal TRIM. The trim signal TRIM includes a plurality of bits and a level of the reference voltage VREF may be determined based on values of the bits of the trim signal TRIM.

The boosted voltage generator 410 may generate a boosted voltage VPP following a target level based on the first pulse signal P1, the second pulse signal P2, the reference voltage VREF and a power supply voltage VDDC. When the voltage generator 400 starts to operate, a level of the power supply voltage VDDC gradually increases. The boosted voltage generator 410 may generate the boosted voltage VPP that increases to the target level as the level of the power supply voltage VDDC gradually increases.

The negative voltage generator 480 may generate a negative voltage VBB. The boosted voltage VPP and the negative voltage VBB are provided to the sub word-line driver SWD and the sub word-line driver SWD may activate a corresponding word-line with a level of the boosted voltage VPP or may deactivate the corresponding word-line with a level of the negative voltage VBB.

Although in FIG. 12, the reference voltage generator 490 and the pulse generator 495 are not included in the boosted voltage generator 410, the boosted voltage generator 410 may include the reference voltage generator 490 and the pulse generator 495 therein in some example embodiments.

In addition, the control signals CTLs in FIG. 3 may include the clock signals CLK0 and CLK1 and the trim signal TRIM. The clock signal CLK0 may be provided to the pulse generator 495 in a stand-by mode in which the level of the power supply voltage VDDC is unstable, and the clock signal CLK1 may be provided to the pulse generator 495 in an operation mode in which the level of the power supply voltage VDDC is stable. For example, the pulse generator 495 generates the first pulse signal P1 and the second pulse signal P2 based on the clock signal CLK0 in the stand-by mode and generates the first pulse signal P1 and the second pulse signal P2 based on the clock signal CLK1 in the operation mode.

Figure 13:
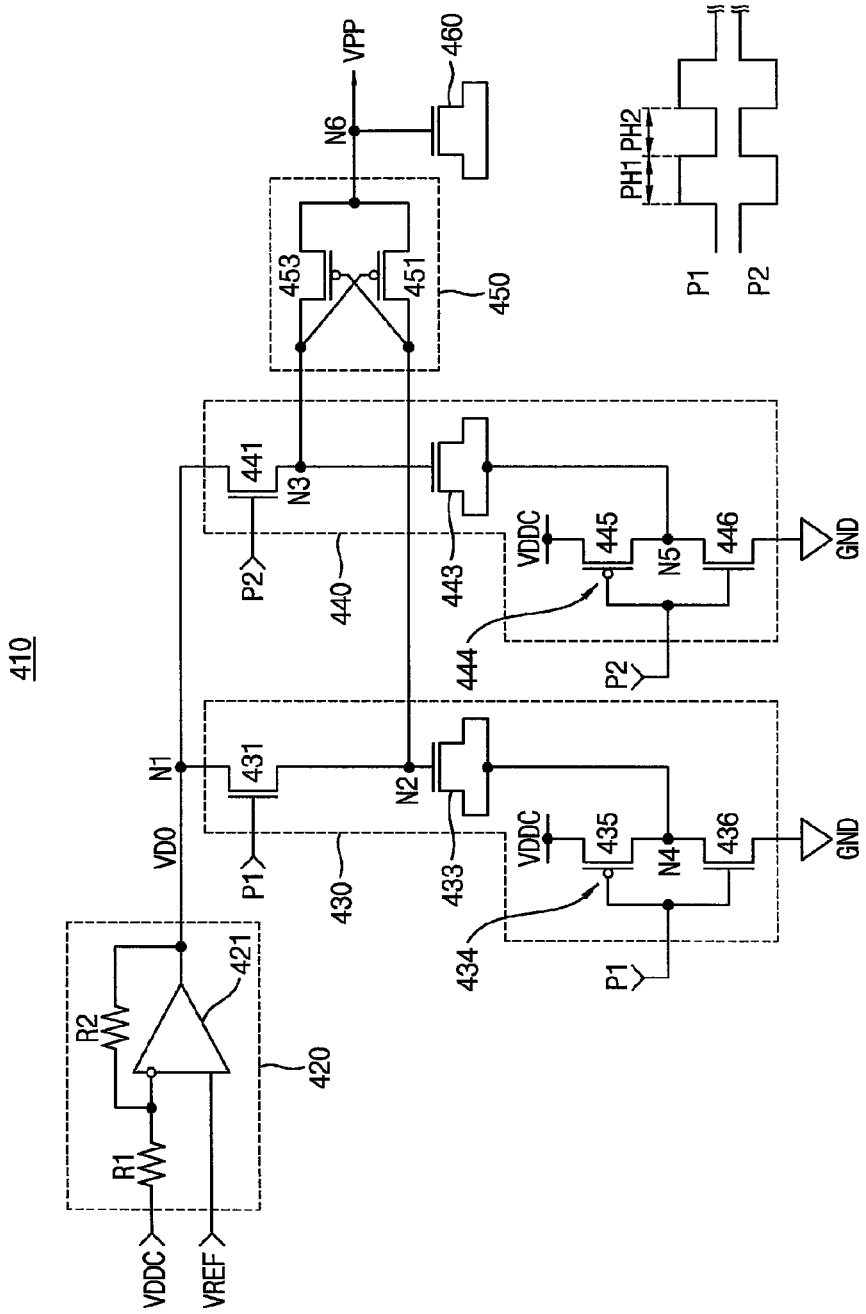
FIG. 13 is a circuit diagram illustrating an example of the boosted voltage generator in FIG. 12 according to example embodiments.

FIG. 13 is a circuit diagram illustrating an example of the boosted voltage generator in FIG. 12 according to example embodiments.

Referring to FIG. 13, the boosted voltage generator 410 may include a difference voltage generator 420, a first charging circuit 430, a second charging circuit 440, a switch circuit 450 and a metal-oxide semiconductor (MOS) capacitor 460.

The difference voltage generator 420 may generate a difference voltage VDO at a first node N1, based on the reference voltage VREF and the power supply voltage VDDC.

The difference voltage generator 420 may include an operational amplifier 421, a first resistor R1 and a second resistor R2. The operational amplifier 421 has a first input terminal, a second input terminal and an output terminal. The first input terminal receives the power supply voltage VDDC through the first resistor R1. The second input terminal receives the reference voltage VREF and the output terminal is connected to the first node N1. The second resistor R2 is connected to the first input terminal and the output terminal. The first resistor R1 and the second resistor R2 may have a same resistance of R. For example, the difference voltage VDO may correspond to 2*VREF−VDDC.

The first charging circuit 430 is connected between the first node N1 and a ground voltage GND, and the first charging circuit 430 may charge the difference voltage VDO therein during a first phase.

The first charging circuit 430 may include an n-channel metal-oxide semiconductor (NMOS) transistor 431, a MOS capacitor 433, an inverter 434 having a p-channel metal-oxide semiconductor (PMOS) transistor 435 and an NMOS transistor 436.

The NMOS transistor 431 has a drain coupled to the first node N1, a gate receiving the first pulse signal P1 and a source coupled to a second node N2. The MOS capacitor 433 has a gate coupled to the second node N2, a source and a drain which are coupled to each other. In the inverter 434, the PMOS transistor 435 has a source coupled to the power supply voltage VDDC, a gate receiving the first pulse signal P1 and a drain coupled to a fourth node N4, and the NMOS transistor 436 has a drain coupled to the fourth node N4, a gate receiving the first pulse signal P1 and a source coupled to the ground voltage GND. The second charging circuit 440 is connected between the first node N1 and the ground voltage GND, and the second charging circuit 440 may charge the difference voltage VDO therein during a second phase PH2.

The second charging circuit 440 may include an NMOS transistor 441, a MOS capacitor 443, an inverter 444 having a PMOS transistor 445 and an NMOS transistor 446.

The NMOS transistor 441 has a drain coupled to the first node N1, a gate receiving the second pulse signal P2 and a source coupled to a third node N3. The MOS capacitor 443 has a gate coupled to the third node N3, a source and a drain which are coupled to each other. In the inverter 444, the PMOS transistor 445 has a source coupled to the power supply voltage VDDC, a gate receiving the second pulse signal P2 and a drain coupled to a fifth node N5, and the NMOS transistor 446 has a drain coupled to the fifth node N5, a gate receiving the second pulse signal P2 and a source coupled to the ground voltage GND. The switch circuit 450 is connected to the second node N2, the third node N3 and an output node N6, and provides the boosted voltage VPP following the target level in each of the first phase and the second phase.

The switch circuit 450 may include PMOS transistors 451 and 453. The PMOS transistor 451 has a source coupled to the second node N2, a drain coupled to the output node N6 and a gate coupled to the third node N3. The PMOS transistor 453 has a source coupled to the third node N2 a drain coupled to the output node N6 and a gate coupled to the second node N2. The PMOS transistors 451 and 453 may be coupled to each other with a cross-coupled latch configuration.

The MOS capacitor 460 may be an NMOS capacitor that has a gate coupled to the output node N6 and a drain and a source coupled to each other.

The first pulse signal P1 has a first logic level (logic high level) and the second pulse signal P2 has a second logic level (logic low level) during a first phase PH1. The first pulse signal P1 has a second logic level (logic low level) and the second pulse signal P2 has a first logic level (logic high level) during a second phase PH2. The first phase PHI and the second phase PH2 may be alternatingly repeated with a same period.

Hereinafter, a voltage of each of the second to fifth nodes N2 to N5 is represented as VN2 to VN5.

In example embodiments, when the first pulse signal P1 is at a high level in the first phase PH1, the NMOS transistors 431 and 436 are turned on and the PMOS transistor 435 is turned off. For example, the first charging circuit 430 conducts a first current path from the first node N1 to the ground voltage GND and the difference voltage VDO is charged in the MOS capacitor 433 in the first phase PH1. For example, the voltage VN2 of the second node N2 may be boosted to VDO+VN4 by a charge coupling effect of the MOS capacitor 433 in the second phase PH2. As a result, the fourth node N4 is discharged to the ground voltage GND, and the second node N2 is charged with the difference voltage VDO and also is affected by a charge coupling effect of the MOS capacitor 433 in the first phase PH1.

Since the second signal P2 is at a low level in the first phase PH1, the NMOS transistors 441 and 446 are turned off and the PMOS transistor 445 is turned on. For example, the voltage VN3 of the third node N3 may be boosted to VDO+VN5 by a charge coupling effect of the MOS capacitor 443 in the first phase PH1. As a result, the fifth node N5 is precharged to the power supply voltage VDDC, and the third node N3 is boosted with a voltage of 2*VREF in the first phase PH1.

In addition, since the PMOS transistor 453 is turned on by the voltage of the second node N2 and the PMOS transistor 451 is turned off by the voltage of the third node N3 in the first phase PH1, the voltage charged in the MOS capacitor 433 is discharged to the MOS capacitor 460 and the boosted voltage VPP of 2*VREF is provided at the output node N6. For example, a voltage level of the boosted voltage VPP may be variable based on a voltage level of the reference voltage VREF.

The switch circuit 450 provides the voltage of the third node N3 to the output node N6 as the boosted voltage VPP through the PMOS transistor 453 in the first phase PH1.

In example embodiments, when the second pulse signal P2 is at a high level in the second phase PH2, the NMOS transistors 441 and 446 are turned on and the PMOS transistor 445 is turned off. For example, the second charging circuit 440 conducts a second current path from the first node N1 to the ground voltage GND and the difference voltage VDO is charged in the MOS capacitor 443 in the second phase PH2. For example, the voltage VN3 of the third node N3 may be boosted to VDO+VN5 (voltage of the fifth node N5) by a charge coupling effect of the MOS capacitor 443 in the first phase PH1. The fifth node N5 is discharged to the ground voltage GND, and the third node N3 is charged with the difference voltage VDO and also affected by a charge coupling effect of the MOS capacitor 443 in the second phase PH2.

Since the first signal P1 is at a low level in the second phase PH2, the NMOS transistors 431 and 436 are turned off and the PMOS transistor 435 is turned on. In this case, the voltage of the second node N2 may be boosted to VDO+VN4 (voltage of the fourth node N4) by a charge coupling effect of the MOS capacitor 433 in the second phase PH2. As result, the fourth node N4 is precharged to the power supply voltage VDDC, and the MOS capacitor 433 is charged with a voltage of VDO+VN4 (e.g., 2*VREF) in the second phase PH2.

In addition, since the PMOS transistor 453 is turned off by the voltage of the second node N2 and the PMOS transistor 451 is turned on by the voltage of the third node N3 in the second phase PH2, the voltage charged in the MOS capacitor 443 is discharged to the MOS capacitor 460 and the boosted voltage VPP of 2*VREF is provided at the output node N6. For example, a voltage level of the boosted voltage VPP may be variable based on a voltage level of the reference voltage VREF.

The switch circuit 450 provides the voltage of the second node N2 to the output node N6 as the boosted voltage VPP through the PMOS transistor 451 in the second phase PH2.

As illustrated in FIG. 13, the boosted voltage generator 410 does not include a feedback path through which the boosted voltage VPP is provided to the difference voltage generator 420. For example, the boosted voltage generator 410 is not associated with a stability problem that may occur in a boosted voltage generator employing a feedback path or a charge pump employing a feedback path. In addition, the boosted voltage VPP follows the target level of 2*VREF, the boosted voltage VPP may not be influenced by a variance of the power supply voltage VDDC. Therefore, the boosted voltage generator 410 may reduce occupied area by simplifying circuit configuration. In addition, the boosted voltage generator 410 may generate the target boosted voltage VPP in a short time even at a low power supply voltage VDDC.

Figure 14:
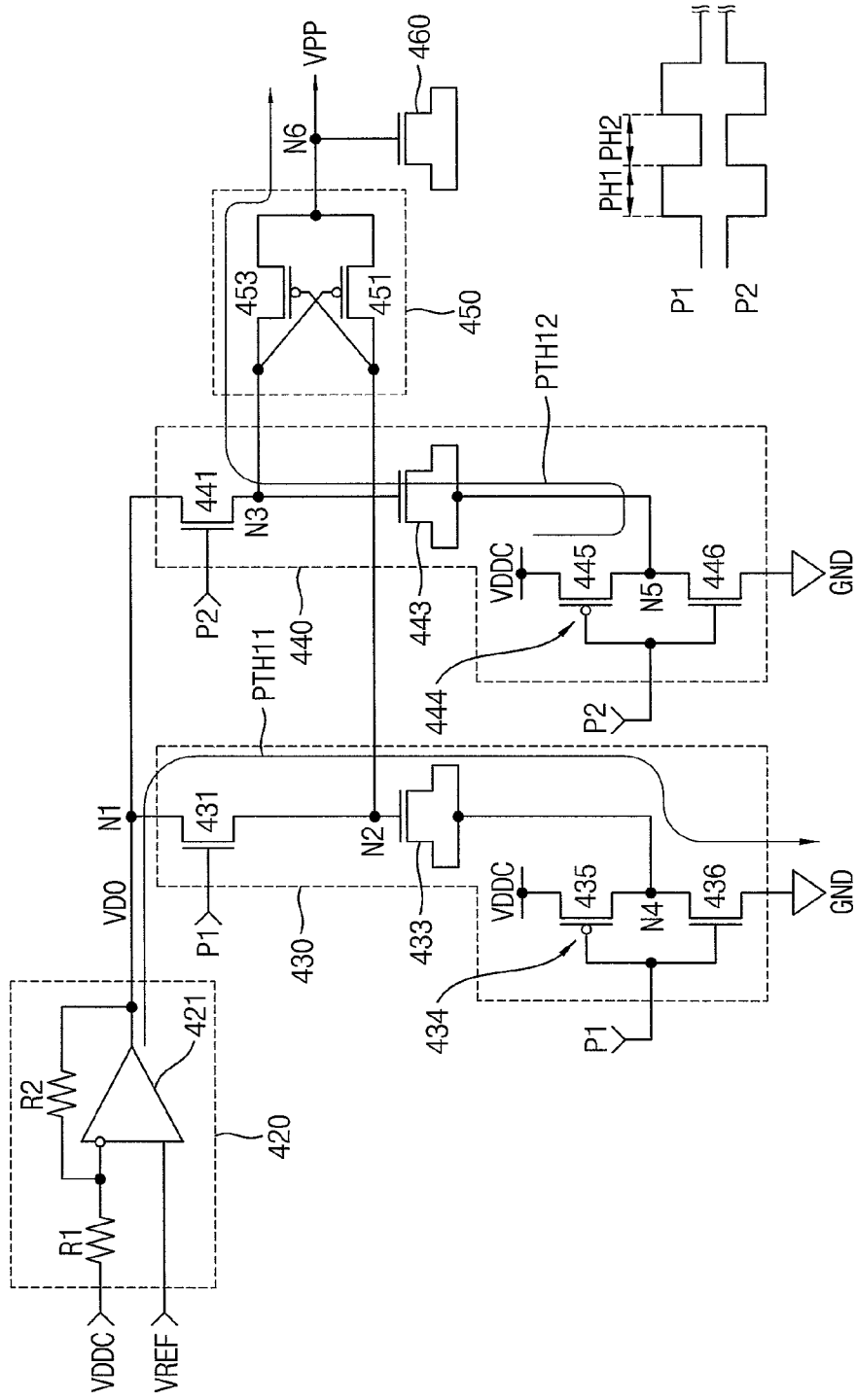
FIG. 14 illustrates an operation of the boosted voltage generator of FIG. 13 in the first phase.

FIG. 14 illustrates an operation of the boosted voltage generator of FIG. 13 in the first phase PH1.

Referring to FIG. 14, the first charging circuit 430 provides the current path via a first path PTH11 from the first node N1 to the ground voltage GND to charge the difference voltage VDO in the MOS capacitor 433 and the second charging circuit 440 provides the boosted voltage VPP corresponding to the voltage 2*VREF to the output node N6 through a second path PTH12 in the first phase PHI as described with reference to FIG. 13.

Figure 15:
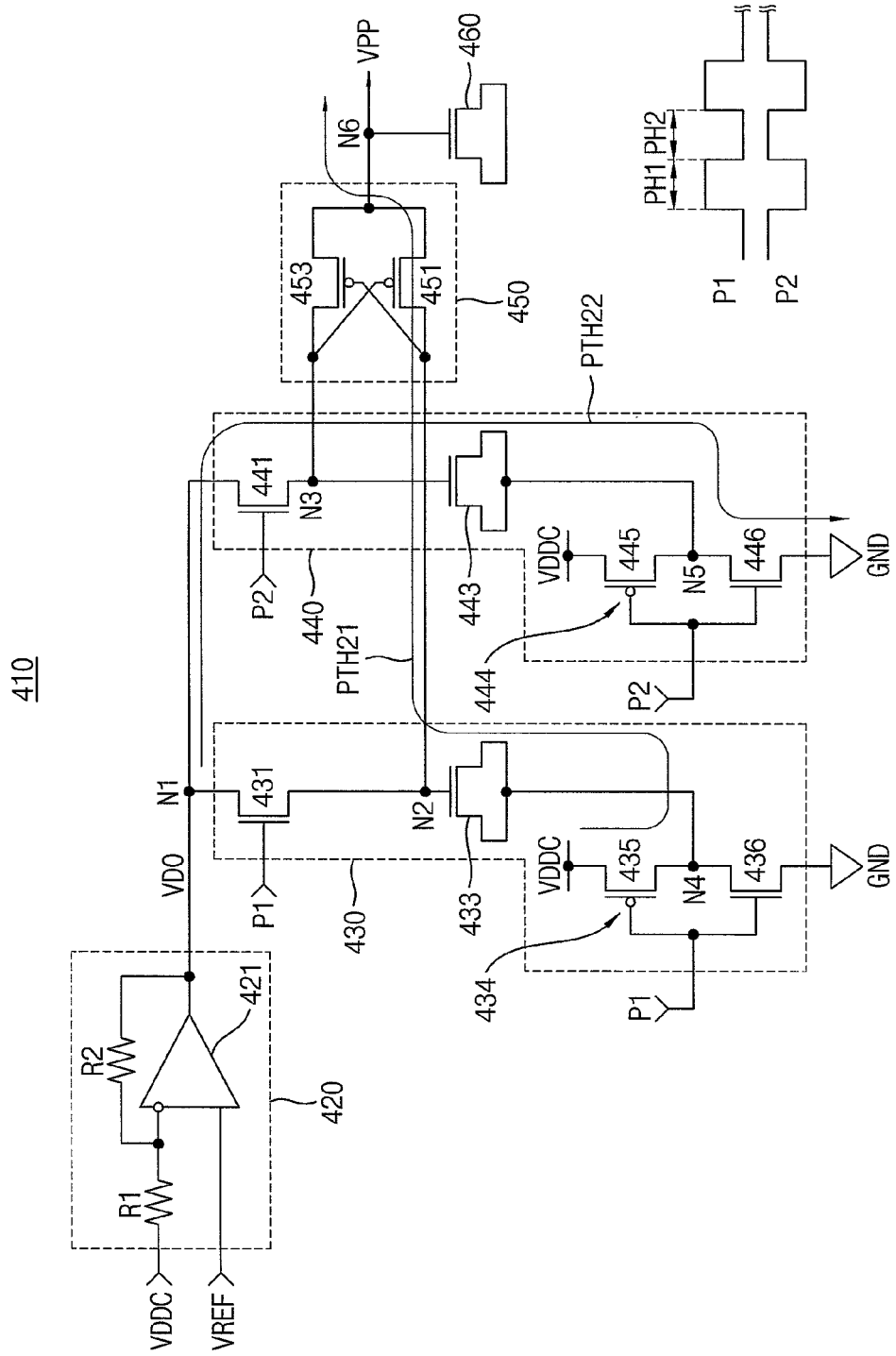
FIG. 15 illustrates an operation of the boosted voltage generator of FIG. 13 in the second phase.

FIG. 15 illustrates an operation of the boosted voltage generator of FIG. 13 in the second phase PH2.

Referring to FIG. 15, the first charging circuit 430 provides the boosted voltage VPP corresponding to the voltage 2*VREF to the output node N6 through a first path PTH21 and the second charging circuit 440 provides the current path via a second path PTH22 from the first node N1 to the ground voltage GND to charge the difference voltage VDO in the MOS capacitor 443 in the second phase PH2 as described with reference to FIG. 13.

Figure 16:
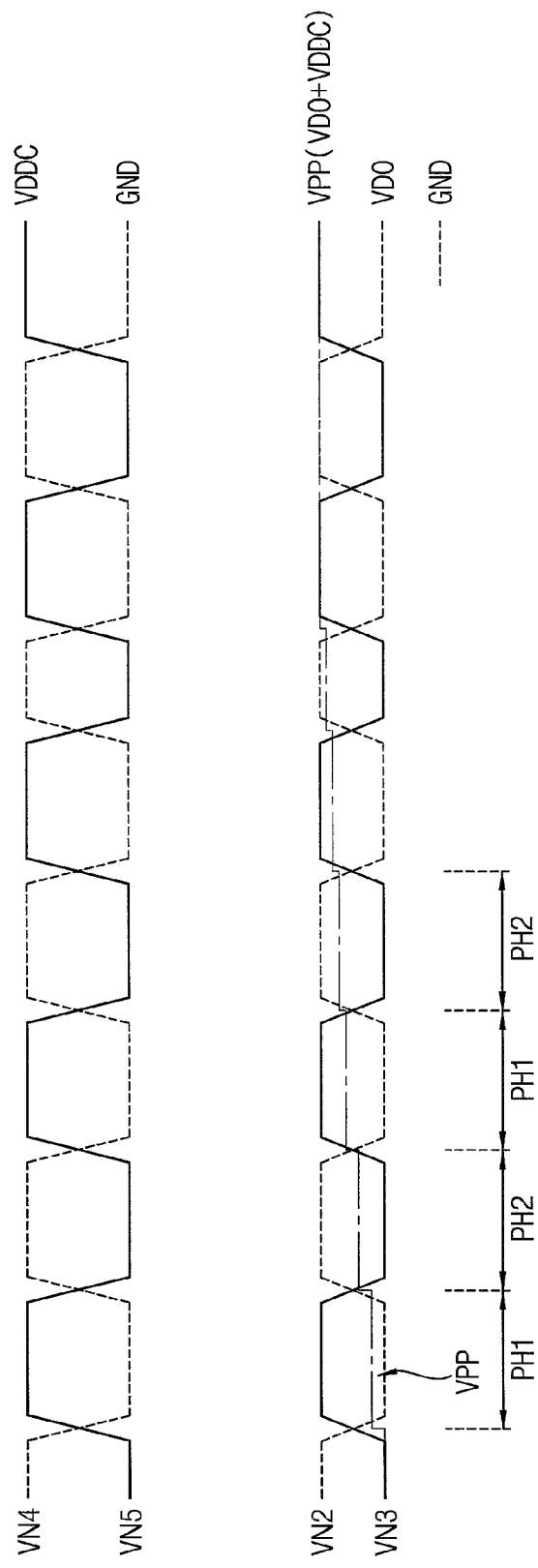
FIG. 16 illustrates various voltages of the boosted voltage generator of FIG. 13 as the first phase and the second phase are alternatingly repeated.

FIG. 16 illustrates various voltages on internal nodes of the boosted voltage generator of FIG. 13 as the first phase and the second phase are alternatingly repeated.

Referring to FIGS. 13 through 16, as the first phase PHI and the second phase PH2 are alternatingly repeated, the voltage VN2 of the second node N2 and the voltage VN3 of the third node N3 are alternatingly charged and discharged and the level of the boosted voltage VPP gradually rises to the target level VPP. It is also noted that as the first phase PHI and the second phase PH2 are alternatingly repeated, the fourth node N4 and the fifth node N5 are alternatingly discharged to the ground voltage GND and precharged with the power supply voltage VDDC. For example, each of the voltage VN2 and the voltage VN3 may have a high level of VDO+VN4 and VDO+VN5, and a low level of VDO, respectively.

Figure 17:
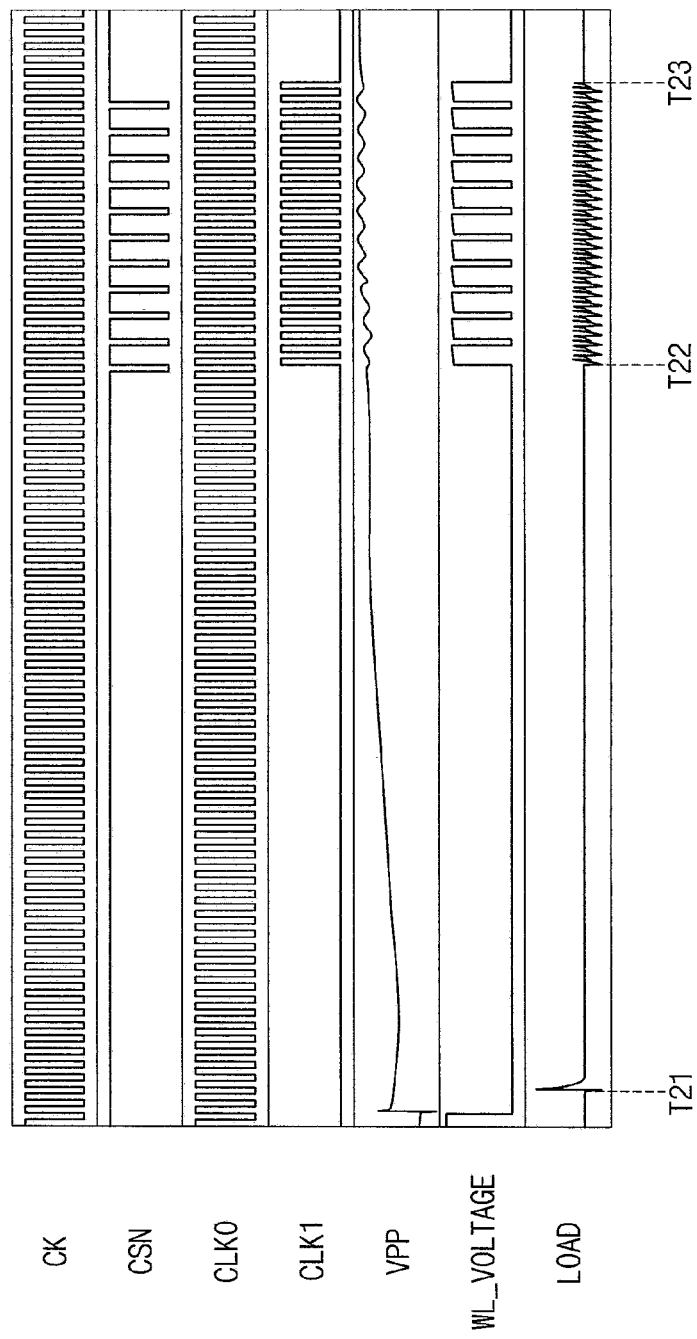
FIG. 17 illustrates various signals in the resistive type memory device of FIG. 3, which includes the boosted voltage generator of FIG. 13.

FIG. 17 illustrates various signals on internal nodes of the resistive type memory device of FIG. 3, which includes the boosted voltage generator of FIG. 13.

In FIG. 17, CK denotes a clock signal that is applied to the resistive type memory device 200a, CSN denotes a chip selection signal that is applied to the resistive type memory device 200a, CLK0 denotes a stand-by clock signal that is applied to the pulse generator 495 in the stand-by mode and CLK1 denotes an operating clock signal that is applied to the pulse generator 495 in the operating mode.

Referring to FIGS. 12 through 15 and 17, the boosted voltage generator 410 starts to operate at a time T21, the level of the power supply voltage VDDC gradually rises during the stand-by mode between times T21 and T22 and the pulse generator 495 generates the first pulse signal P1 and the second pulse signal P2 based on the clock signal CLK0 between the times T21 and T22. When the level of the boosted voltage VPP rises to the target level at the time T22, the pulse generator 495 generates the first pulse signal P1 and the second pulse signal P2 based on the clock signal CLK1, the boosted voltage generator 410 generates the boosted voltage VPP having the target level and the row decoder 260a drives a corresponding word-line with the booted voltage VPP between times T22 and T23. After the time T23, the row decoder 260 does not drive the corresponding word-line. As the corresponding word-line is driven between the times T22 and T23, voltage WL_VOLT- AGE of the corresponding word-line changes and a load LOAD coupled to the boosted voltage generator 410 may operate.

Figure 18:
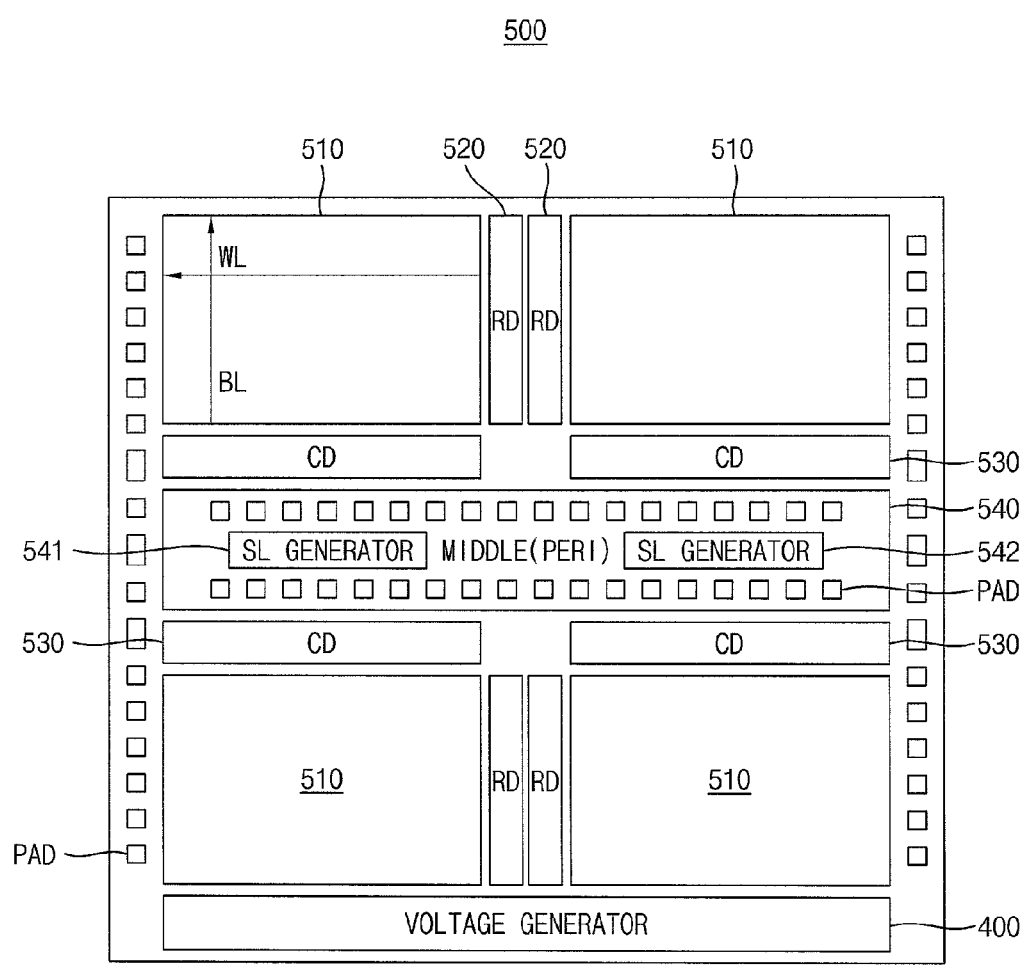
FIG. 18 illustrates a layout of a resistive type memory device according to example embodiments.

FIG. 18 illustrates a layout of a resistive type memory device according to example embodiments.

Referring to FIG. 18, a resistive type memory device 500 may include four bank arrays 510. A plurality of sub array blocks including a plurality of STT-MRAM cells may be disposed in each of the bank arrays 510. A row decoder 520 and a column decoder 530 may be disposed adjacent to each of the bank arrays 510. Also, pads PAD used to communicate with the outside may be disposed in peripheral regions disposed in the edges and center of the resistive type memory device 500. Furthermore, source line voltage generators 541 and 542 may be disposed in the peripheral region disposed in the center of the resistive type memory device 500. The row decoders 520, the column decoders 530, and the source line voltage generators 541 and 542 may constitute peripheral circuits. The voltage generator 400 may be disposed in lower region of the resistive type memory device 500.

Although FIG. 18 shows an embodiment in which two source line voltage generators 541 and 542 are provided, source line voltage generators may be provided in equal number to the number of bank arrays 510 so that source line driving voltages can be respectively applied to the bank arrays 510.

The row decoders 520 may be disposed in a word-line direction WL of the resistive type memory device 500, while the column decoders 530 may be disposed in a bit-line direction BL thereof. Furthermore, the row decoders 520 allocated respectively to two adjacent bank arrays 510 may be disposed adjacent to each other and share a control line (not shown) therebetween.

Figure 19:
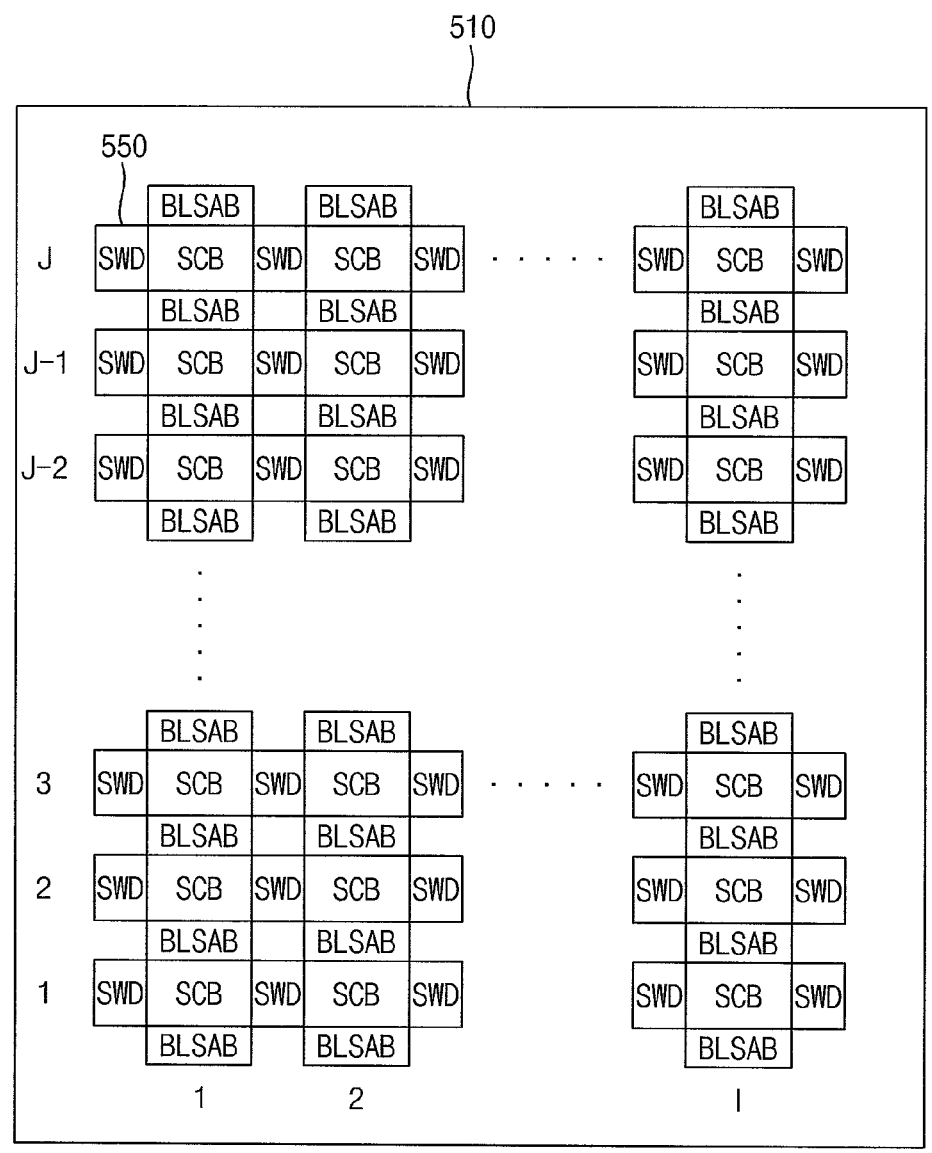
FIG. 19 illustrates a layout of a bank array in FIG. 18 according to example embodiments.

FIG. 19 illustrates a layout of a bank array in FIG. 18 according to example embodiments.

Referring to FIG. 19, in the bank array 510, I sub array blocks SCB may be disposed in a first direction D1, and J sub array blocks SCB may be disposed in a second direction D2 orthogonal to the first direction D1. A plurality of bit-lines, a plurality of word-lines, and a plurality of STT-MRAM cells may be disposed in each of the sub array blocks SCB. The plurality of STT-MRAM cells may be disposed at intersections between the bit-lines and the word-lines.

I+1 sub word-line driver regions SWD may be disposed between the sub array blocks SCB in the first direction D1. Sub word-line drivers may be disposed in the sub word-line driver regions SWD.

J+1 bit-line sense amplifier regions BLSAB may be disposed along the sub array blocks SCB in the second direction D2 (e.g., with a bit-line sense amplifier region BLSAB occupying each space between sub array blocks SCB, and a bit-line sense amplifier region BLSAB at either end of a group of sub array blocks SCB in the second direction D2). Bit-line sense amplifier circuits to sense data stored in resistive type memory cells may be disposed in the bit-line sense amplifier regions BLSAB.

Figure 20:
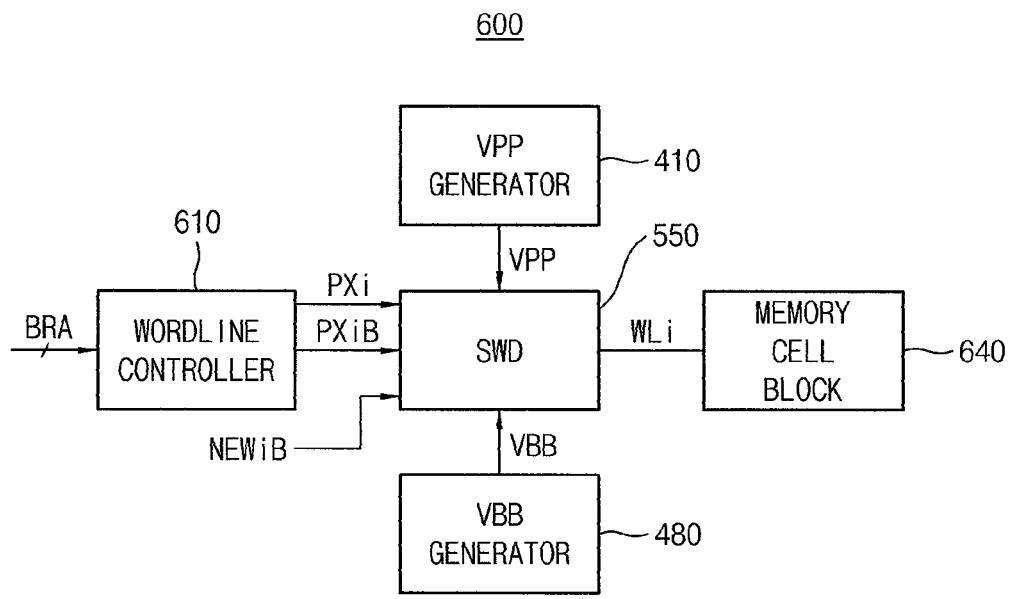
FIG. 20 is a block diagram illustrating a resistive type memory device according to example embodiments.

FIG. 20 is a block diagram illustrating a resistive type memory device according to example embodiments.

Referring to FIG. 20, a resistive type memory device 600 includes a word-line controller 610, at least one memory cell block 640, a boosted voltage generator 410, a negative voltage generator 420, and a sub word-line driver 550.

The at least one memory cell block 640 may include a plurality of resistive type memory cells coupled to a plurality of word-lines WLi, and each of the resistive type memory cells may store data. The boosted voltage generator 410 generates a boosted voltage VPP to the sub word-line driver 550. The negative voltage generator 480 generates a negative voltage VBB to the sub word-line driver 550.

The word-line controller 610 may generate first and second word-line enable control signals PXi and PXiB for controlling the sub word-line driver 550 in response to a decoded row address signal DRA.

The number of the sub word-line drivers 550 in the resistive type memory device 600 is same as the number of the word-lines WLi included in the memory cell block 640.

Figure 21:
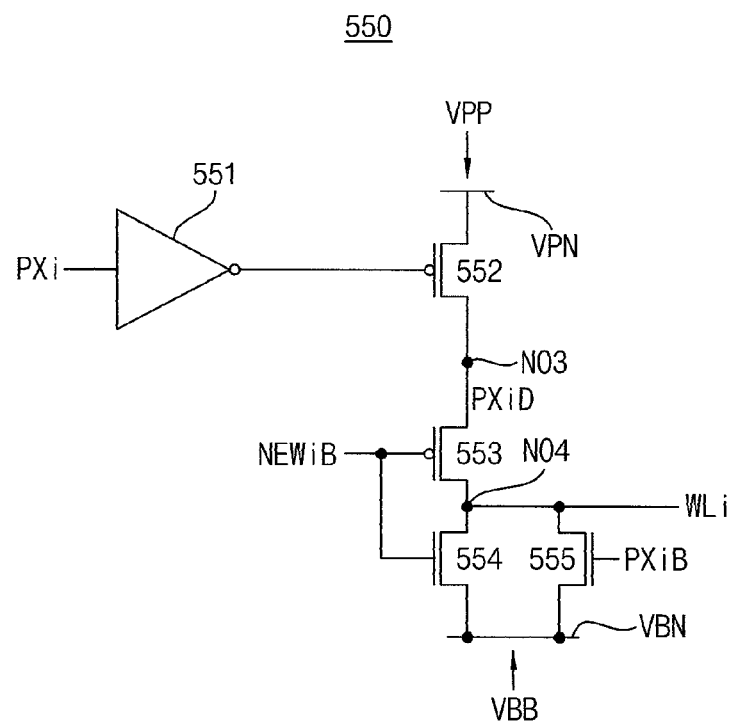
FIG. 21 is a circuit diagram illustrating an example of the sub word-line driver in FIG. 20 according to example embodiments.

FIG. 21 is a circuit diagram illustrating an example of the sub word-line driver in FIG. 20 according to example embodiments.

Referring to FIG. 21, the sub word-line driver 550 includes an inverter 551, PMOS transistors 552 and 553, and NMOS transistors 554 and 555. The PMOS transistor 552 has a source connected to a boosted voltage terminal VPN, a gate receiving an output of the inverter 551 and a drain connected to a boosted node NO3. The PMOS transistor 553 has a source connected to the boosted node NO3, a gate receiving word-line enable signal NEWiB and a drain connected to an enable node NO4. The NMOS transistor 554 has a drain connected to the enable node NO4, gate receiving the word-line enable signal NEWiB and a source connected to a negative voltage terminal VBN. The NMOS transistor 555 has a drain connected to the enable node NO4, gate receiving the second word-line enable control signal PXiB and a source connected to the negative voltage terminal VBN. The boosted voltage VPP is applied to the boosted voltage terminal VPN and the negative voltage VBB is applied to the negative voltage terminal VBN.

The PMOS transistor 552 receives the boosted voltage VPP, and transfers the boosted voltage to the boost node NO3 in response to the first word-line enable control signal PXi. The PMOS transistor 553 receives the boosted voltage from the PMOS transistor 552 through a source and enables a corresponding word line WLi connected to the enable node NO4 with the boosted voltage VPP in response to the word-line enable signal NEWiB. The NMOS transistor 554 transfers the negative voltage VBB to the enable node NO4 in response to the word line enable signal NEWiB, and the NMOS transistor 555 disables the corresponding word line WLi connected to the enable node NO4 with the negative voltage VBB in response to the second word-line enable control signal PXiB.

Figure 22:
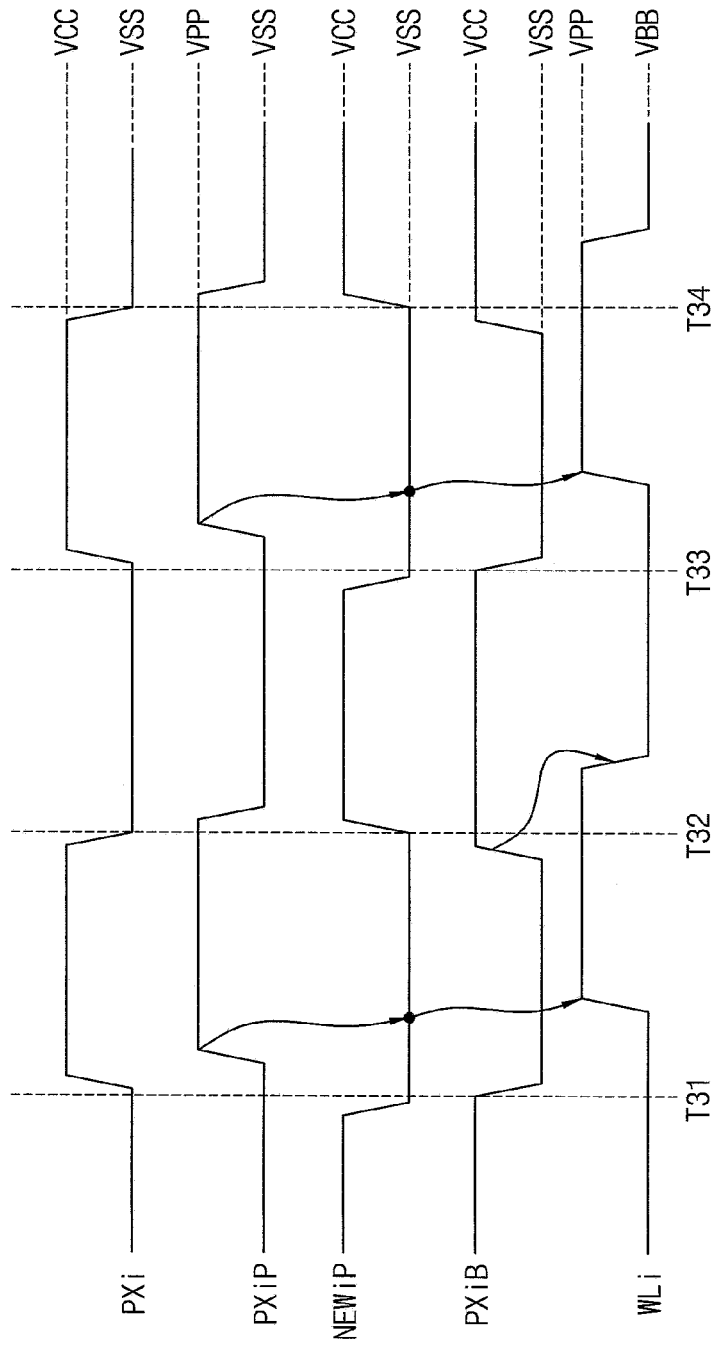
FIG. 22 is a timing diagram illustrating an operation of the word-line in the resistive type memory device of FIG. 20 according to example embodiments.

FIG. 22 is a timing diagram illustrating an operation of the word-line in the resistive type memory device of FIG. 20 according to example embodiments.

Referring to FIGS. 20 through 22, the first word-line enable control signal PXi is logic low level initially, transitions to logic high level VCC (hereinafter, VCC may refer to VDDC) at each time T31 and T33 when the corresponding word-line is to be enabled in response to a row address and transitions to logic low level VSS at each time T32 and T34 when other word-lines are enabled.

A boosted node voltage signal PXiD is logic low level initially, transitions to the boosted voltage at each time T31 and T33 when first word-line enable control signal PXi transitions to logic high VCC and transitions to the ground voltage at each time T12 and T14 when first word-line enable control signal PXi transitions to logic low VSS level.

After a corresponding word line WLi is disabled while the word line enable signal NEWiB is initially maintained at the logic high VCC level, the word line enable signal NEWiB transitions to the logic low level VSS at each time T31 and T33 when the row decoder activates the corresponding word line WLi, and transitions to logic low level VSS at each time T32 and T34 when other word-lines are enabled.

After the corresponding word line WL is disabled to the ground voltage while the second word-line enable control signal PXiB is initially maintained at the high level, the word line enable control signal PXiB transits to the low level at each time T31 and T33 the corresponding word line WLi is enabled. When other word-lines are enabled, the second word line-enable control signal PXiB re-transitions to the high level VCC at each time T32 and T34.

The corresponding word-line WLi is initially maintained at the negative voltage level in response to the second word-line enable control signal PXiB, and the boost node voltage signal PXiD is delayed for a given time and transferred when the word line enable signal NEWiB transitions to the logic low level at each time T31 and T33. When other word -lines are activated and the word-line enable bar signal NEWiB transitions to the logic high level at each time T32 and T34, the corresponding word-line signal WL is disabled to the negative voltage VBB level in response to the second word-line enable control signal PXiB.

Figure 23:
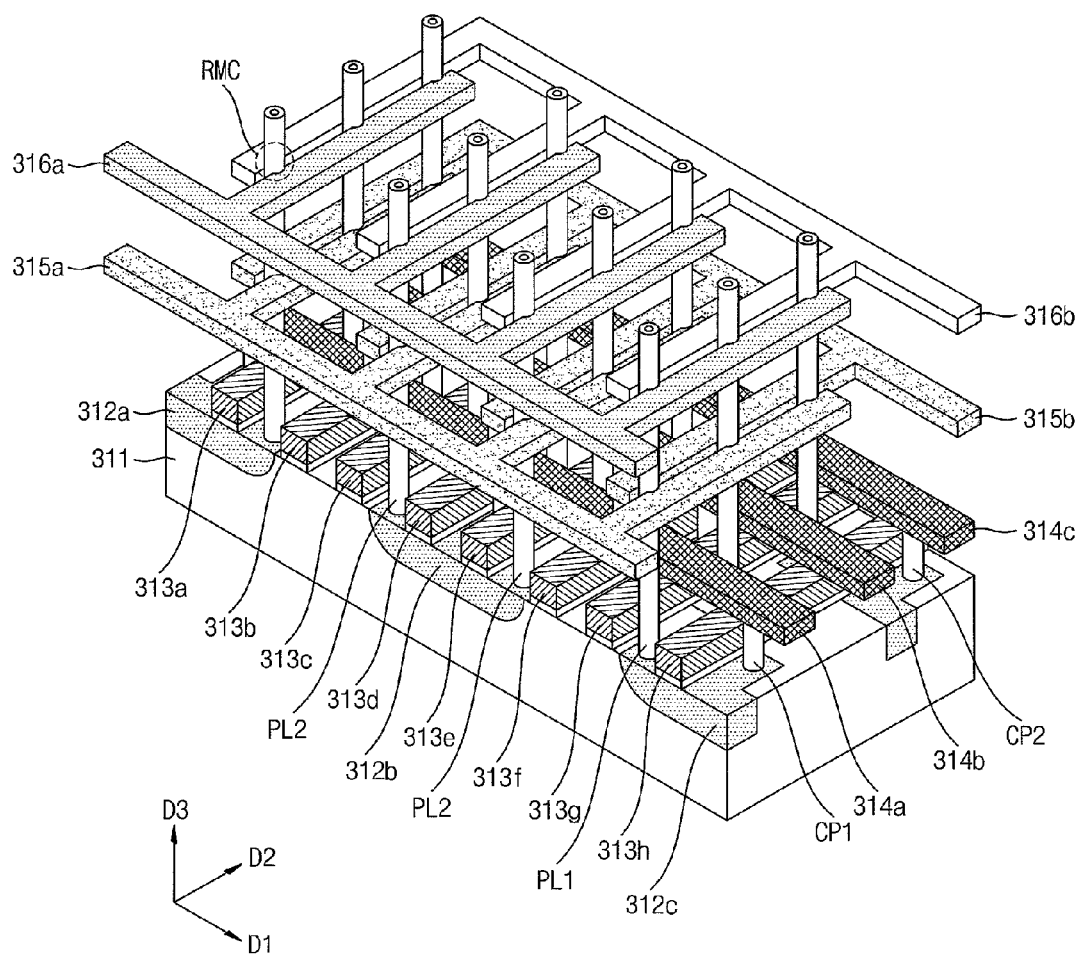
FIG. 23 is a perspective view schematically illustrating a three-dimensional structure of a memory cell array in FIG. 3.

FIG. 23 is a perspective view schematically illustrating a three-dimensional structure of a memory cell array in FIG. 3.

Referring to FIG. 23, the memory cell array 300 includes structures extending along multiple directions D1, D2 and D3.

The memory cell array 300 is formed on a substrate 311. For example, the substrate 311 may be formed of a p-well, in which an element such as boron is injected. Alternatively, the substrate 311 may be a pocket p-well provided within an n-well. For purpose of discussion, it is assumed that the substrate 311 is a p-well, although the substrate 311 is not limited thereto.

Multiple doping regions, indicated by illustrative doping regions 312a to 312c, are formed in the substrate 311. For example, the doping regions 312a to 312c may be formed of an n-type conductor different from the substrate 311. However, the inventive concept is not limited thereto. The doping regions 312a to 312c may be formed sequentially in the x-axis direction. This structure may be iterated in the y-axis direction. Word-lines 313a to 313h connected to metal lines formed at multiple layers may be formed over the doping regions 312a to 312c and are electrically isolated from the doping regions 312a to 312c.

The doping regions 312a to 312c may be connected to multiple bit-lines 314a to 314c extending in the direction D1 by contact plugs CP1 and CP2. In addition, the doping regions 312a to 312c may be connected to vertical electrodes of multiple pillars PL1 to PL4. That is, the bit-lines 314a to 314c may be connected to vertical electrodes of the pillars PL1 to PL4 through the doping regions 312a to 312c. Each of the pillars PL1 to PL4 may be connected with metal lines 315a, 315b, 316a, and 316b stacked at multiple layers. The metal lines 315a and 315b, for example, connected to pillars PL1 to PL4 at multiple metal layers in a comb shape, may be connected to a global word line, respectively.

According to the above description, the memory cell array 300 of the resistive memory device may be formed to have a three-dimensional structure. However, the inventive concept is not limited thereto. Resistive type memory cells can be stacked in various manners.

Figure 24:
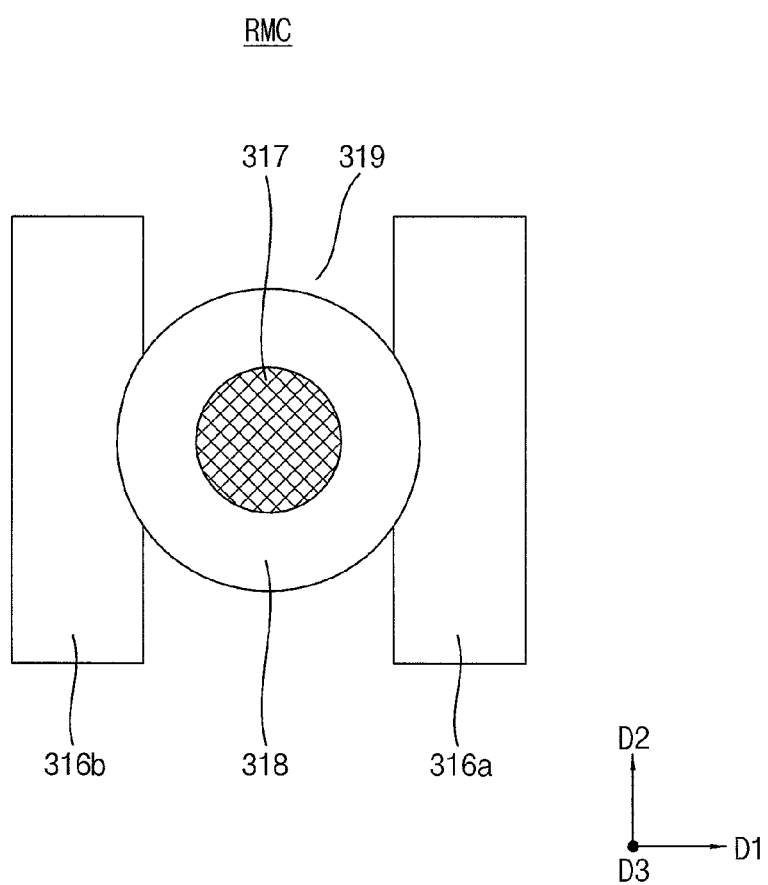
FIG. 24 is a cross-sectional view of a resistive type memory cell formed at one layer in FIG. 23.

FIG. 24 is a cross-sectional view of a resistive type memory cell formed at one layer in FIG. 23.

Referring to FIG. 24, a resistive type memory cell RMC may include a pillar 319 located between first (odd) metal line 316a and second (even) metal line 316b.

A pillar penetrating in a direction D3 perpendicular to a substrate may be formed between the first and second metal lines 316a and 316b forming a horizontal electrode. The pillar 319 may include a data storing film 317 and a vertical electrode 318 that are formed in a cylindrical shape. A resistive type memory cell is formed by the vertical electrode 318 connected to a bit-line and the first and second metal lines 316a and 316b connected to a word-line. The data storing film 317 may be formed by etch and deposition processes, for example, in a vertical direction. The vertical electrode 318 may be formed by a deposition process, for example, such as physical vapor deposition (PVD), chemical vapor deposition (CVD), or atomic layer deposition (AVD).

Figure 25:
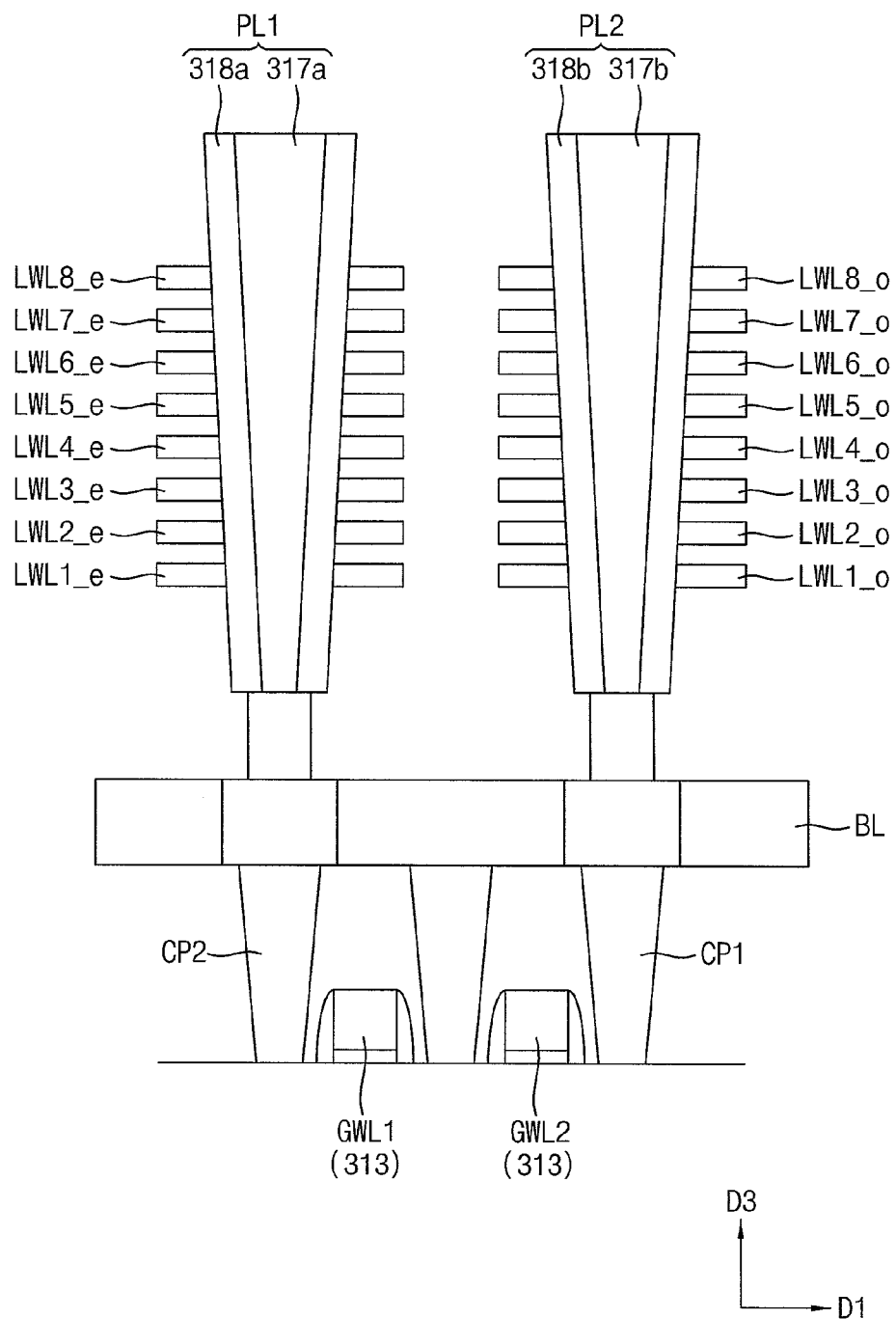
FIG. 25 is a cross-sectional view of a memory cell array in FIG. 23, according to example embodiments.

FIG. 25 is a cross-sectional view of a memory cell array in FIG. 23, according to example embodiments.

Referring to FIG. 25, the memory cell array includes pillars PL1 and PL2, where pillar PL1 forms vertical electrode 318a and data storing film 317a and pillar PL2 forms vertical electrode 318b and data storing film 317b to provide resistive type memory cells. The memory cell array further includes multiple horizontal electrodes LWL1_e to LWL8_e and LWL1_o to LWL8_o stacked in a direction perpendicular to a substrate and connected to the vertical electrodes 318a and 318b, respectively, and bit-lines connected to the vertical electrodes 318a and 318b via doping regions. Global word lines 313 (GWL1 and GWL2) provide word-line voltages to the multiple horizontal electrodes horizontal electrodes LWL1_e to LWL8_e and LWL1_o to LWL8_o.

Figure 26:
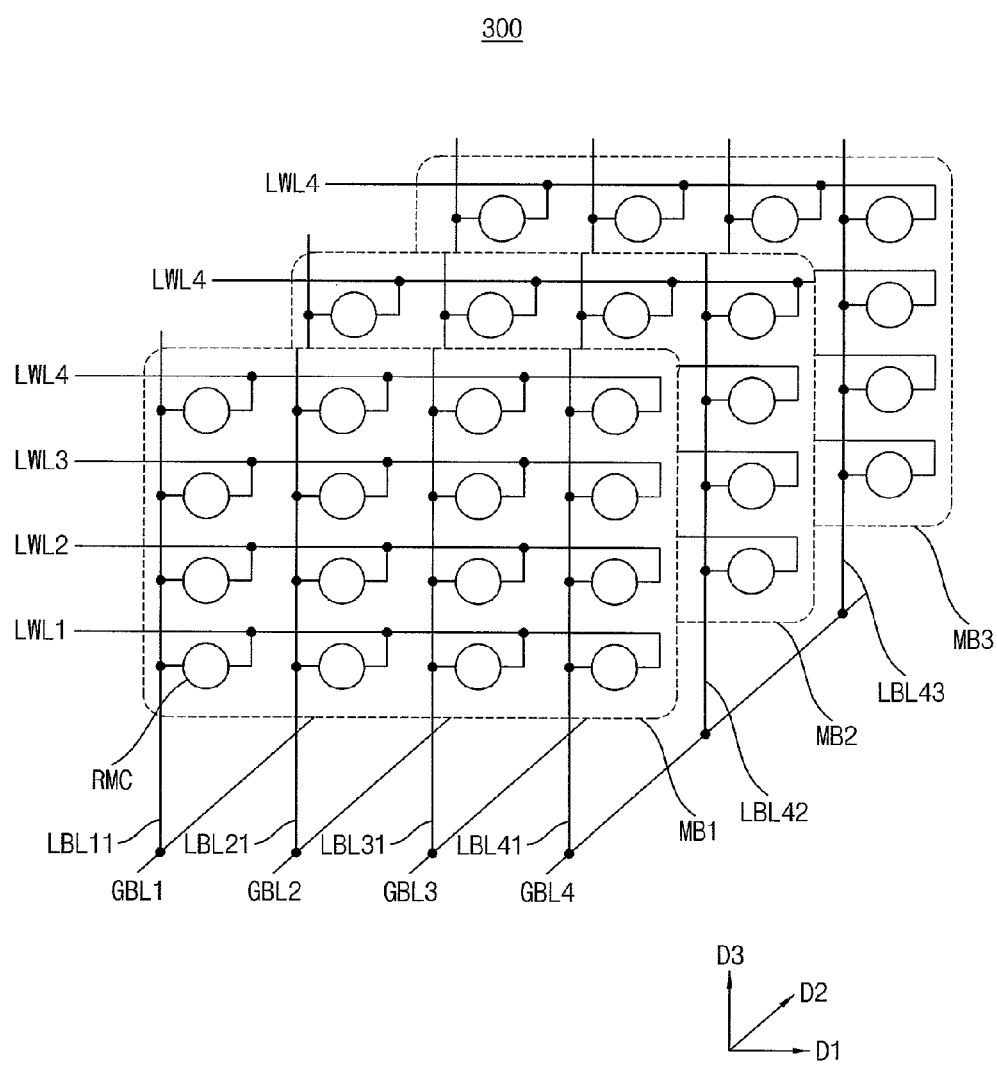
FIG. 26 is a circuit diagram schematically illustrating a memory cell array in FIG. 23, according to example embodiments.

FIG. 26 is a circuit diagram schematically illustrating a memory cell array in FIG. 23, according to example embodiments.

Referring to FIG. 26, the memory cell array 300 includes multiple memory blocks MB1 to MB3, each of which forms a memory block unit in a D1-D3 plane.

The memory cell array 300 includes multiple local bit-lines LBL11~LBL43 extending in parallel in a direction D3 and multiple local word-lines LWL1 to LWL4 extending in parallel in a direction D2 perpendicular to the direction D3. Although not illustrated, each of the memory blocks MB1 to MB3 may be connected to different local word-lines LWL.

The local bit-lines LBL11 to LBL43 formed by vertical channels of pillars are connected to global bit-lines GBL1 to GBL4, respectively. The resistive type memory cells of the memory cell array 300 are be connected to the local word-lines LWL1 to LWL4 and the local bit-lines LBL11 to LBL43 in each of the memory blocks MB1 to MB3. The resistive type memory cells may be programmed or sensed using voltages applied to the local word lines LWL1 to LWL4 and/or the local bit-lines LBL11 to LBL43.

Figure 27:
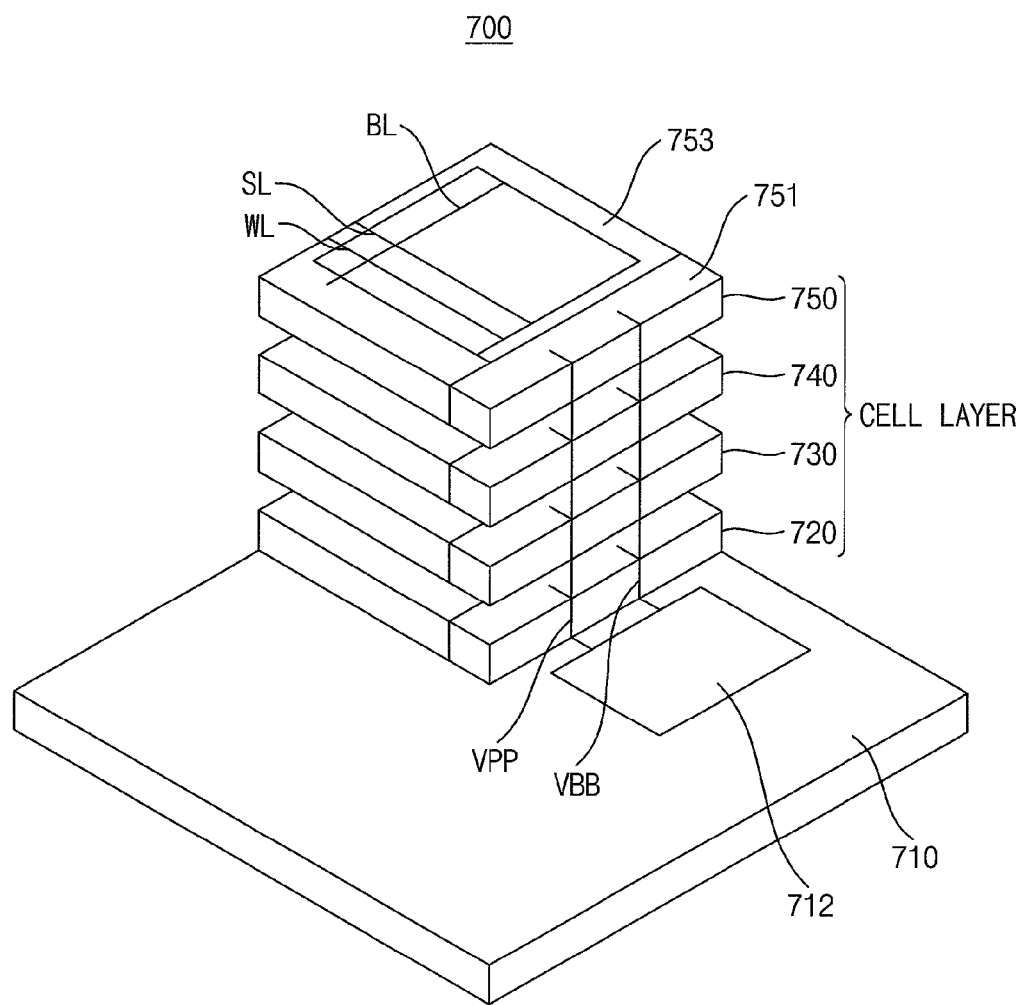
FIG. 27 is a perspective view illustrating a resistive type memory device having a three-dimensional layer stacked structure according to example embodiments.

FIG. 27 is a perspective view illustrating a resistive type memory device having a three-dimensional layer stacked structure according to example embodiments.

Referring to FIG. 27, a resistive type memory device 700 include an interface layer 710, and a plurality of cell layers 720, 730, 740, and 750 stacked on interface layer 710.

The interface layer 710 comprises interface circuits receiving a control signal and data from an external source. The interface layer 710 writes data input from an external source into the cell layers 720, 730, 740, and 750. In addition, the interface layer 710 reads data written in the cell layers 720, 730, 740, and 750 in response to a request from an external source. In a write mode, a boosted voltage VPP and a negative voltage VBB is provided to a word-line coupled to a selected resistive type memory cell.

The Interface layer 710 may include a voltage generator 712 for providing the boosted voltage VPP and the negative voltage VBB. The voltage generator 712 may employ the voltage generator 400 of FIG. 12. Therefore, the voltage generator 712 may include the boosted voltage generator 410 of FIG. 13. Although not illustrated, one cell layer can be formed in the interface layer 710.

Each of cell layers 720, 730, 740, and 750 includes a memory cell region 753 and a logic region 751. Each of the cell layers 720, 730, 740, and 750 is substantially the same as the cell layer 750. Accordingly, only a description of cell layer 750 will be provided.

The logic region 751 includes a write driver for writing a voltage and data provided from the interface layer 710 on the memory cell region 753. The logic region 751 includes a sense amplifier for reading the data written on the memory cell region 753 under the control of the interface layer 710. The logic region 751 further includes an address decoder. The logic region 751 activates the selected word-line using the boosted voltage VPP in a write mode and a read mode.

The memory cell region 753 includes word-lines WL and bit-lines BL arranged in a row and column direction. Additionally, the memory cell region 753 further includes a source-line SL disposed in a row direction. Resistive type memory cells are disposed on intersection points of word-lines WL and bit-lines BL.

In the resistive type memory device 700, the voltage generator 412 can occupy a relatively large area on the interface layer 710. Therefore, the degree of integration in the cell layers 720, 730, 740, and 750 can be increased.

Figure 28:
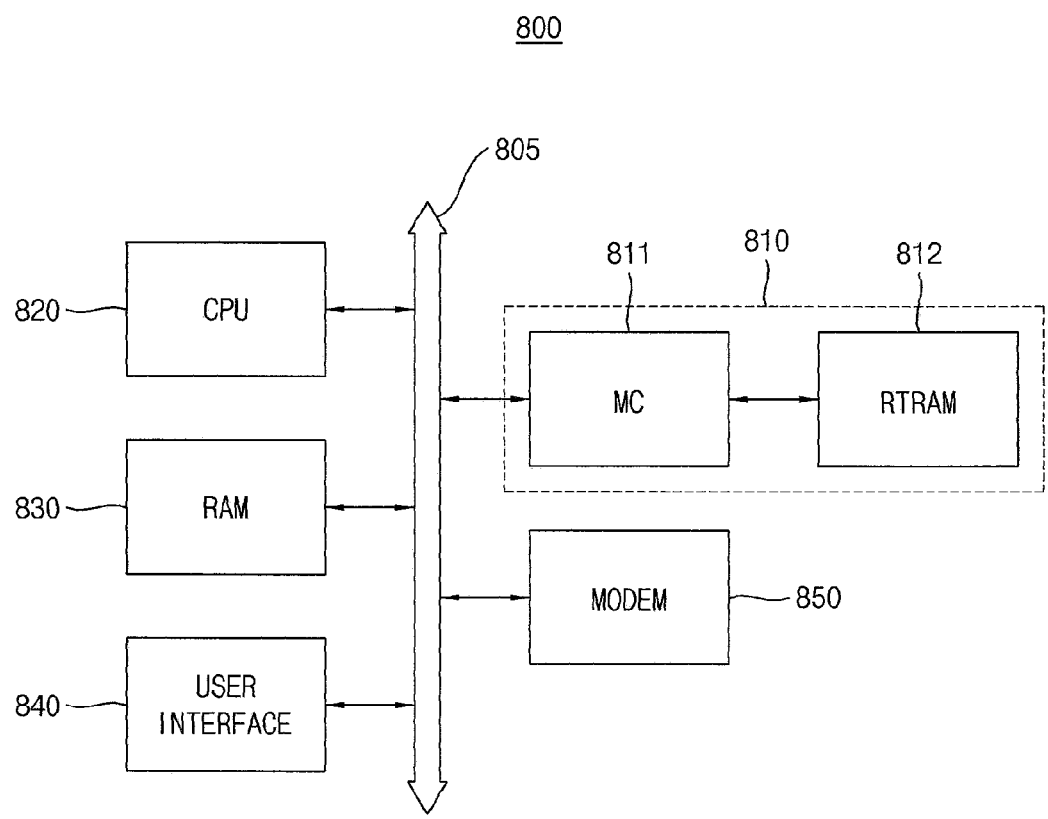
FIG. 28 is a block diagram illustrating a computing system including the resistive type memory device according to example embodiments.

FIG. 28 is a block diagram illustrating a computing system including the resistive type memory device according to example embodiments.

Referring to FIG. 28, a computing system 800 may be included in an electronic device such as a mobile device or a desktop computer. The computing system 800 may include resistive type memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the resistive type memory system 810.

The resistive type memory system 810 may include a resistive type memory device 812 and a memory controller 811. Data processed by the CPU 820 or external data is stored in the resistive type memory device 812. The resistive type memory device 812 may include a boosted voltage generator that generates a boosted voltage following a target level by using a fixed reference voltage without employing a feedback path as described with reference to FIGS. 3 to 22. Therefore, the resistive type memory device 812 may operate stably and simplify circuit configuration.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Figure 29:
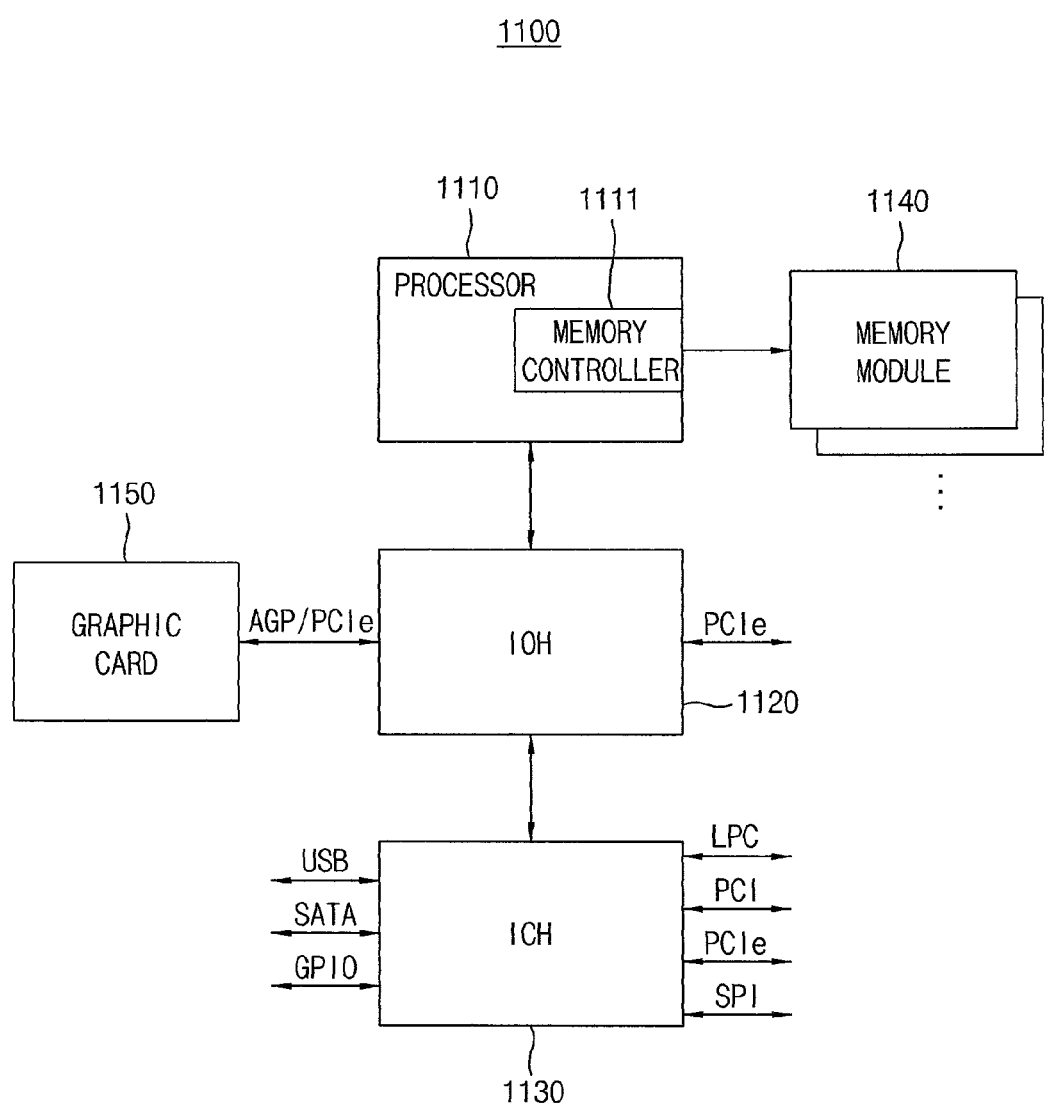
FIG. 29 is a block diagram illustrating a computing system including the resistive type memory device according to example embodiments.

FIG. 29 is a block diagram illustrating a computing system including the resistive type memory device according to example embodiments.

Referring to FIG. 29, a computing system 1100 may include a processor 1110, an input/output hub (IOH) 1120, an input/output controller hub (ICH) 1130, at least one memory module 1140 and a graphics card 1150. In some embodiments, the computing system 1100 may be an electronic device such as a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of resistive type memory devices that store data provided from the memory controller 1111. Each of the plurality of resistive type memory devices may include a boosted voltage generator that generates a boosted voltage following a target level by using a fixed reference voltage without employing a feedback path as described with reference to FIGS. 3 to 22. Therefore, each of the resistive type memory devices may operate stably and simplify circuit configuration.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal resistive type memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present disclosure may be applied to systems using a resistive type memory device. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A boosted voltage generator of a resistive type memory device, the boosted voltage generator comprising:
a difference voltage generator configured to generate a difference voltage to a first node, based on a reference voltage and a power supply voltage;
a first charging circuit connected between the first node and a ground voltage, configured to charge the difference voltage therein during a first phase in response to a first pulse signal;
a second charging circuit, connected between the first node and the ground voltage, configured to charge the difference voltage therein during a second phase in response to a second pulse signal having an opposite phase from the first pulse signal; and a switch circuit connected to a second node in the first charging circuit, a third node in the second charging circuit and an output node, configured to provide a boosted voltage following a target level to the output node during each of the first phase and the second phase.

2. The boosted voltage generator of claim 1, wherein the difference voltage generator comprises:
an operational amplifier including a first input terminal, a second input terminal and an output terminal connected to the first node;
a first resistor connected to the first input terminal; and
a second resistor connected to the first input terminal and the output terminal, wherein the power supply voltage is applied to the first input terminal through the first resistor and the reference voltage is applied to the second input terminal.

3. The boosted voltage generator of claim 2, wherein a first resistance of the first resistor is the same as a second resistance of the second resistor and the difference voltage corresponds to 2*VREF−VDDC, where VREF denotes the reference voltage and VDDC denotes the power supply voltage.

4. The boosted voltage generator of claim 1, wherein the first charging circuit comprises:
a first n-channel metal-oxide semiconductor (NMOS) transistor that has a drain connected to the first node, a gate receiving the first pulse signal and a source connected to the second node;
a metal-oxide semiconductor (MOS) capacitor that has a gate connected to the second node and a source and a drain connected to each other;
a p-channel metal-oxide semiconductor (PMOS) transistor that has a source connected to the power supply voltage, a gate receiving the first pulse signal and a drain connected to a fourth node connected to the MOS capacitor; and
a second NMOS transistor that has a drain connected to the fourth node, a gate receiving the first pulse signal and a source connected to the ground voltage.

5. The boosted voltage generator of claim 4, wherein the first charging circuit is configured to charge the difference voltage in the MOS capacitor by providing a current path from the first node to the ground voltage during the first phase when the first pulse signal has a first logic level, and
the first charging circuit is configured to charge a voltage corresponding to 2*VREF (where VREF denotes the reference voltage) during the second phase when the first pulse signal has a second logic level opposite to the first logic level.

6. The boosted voltage generator of claim 5, wherein the switch circuit provides a voltage of the second node to the output node as the boosted voltage during the second phase.

7. The boosted voltage generator of claim 1, wherein the second charging circuit comprises:
a first n-channel metal-oxide semiconductor (NMOS) transistor that has a drain connected to the first node, a gate receiving the second pulse signal and a source connected to the third node;
a metal-oxide semiconductor (MOS) capacitor that has a gate connected to the third node and a source and a drain connected to each other;
a p-channel metal-oxide semiconductor (PMOS) transistor that has a source connected to the power supply voltage, a gate receiving the second pulse signal and a drain connected to a fifth node connected to the MOS capacitor; and
a second NMOS transistor that has a drain connected to the fifth node, a gate receiving the second pulse signal and a source connected to the ground voltage.

8. The boosted voltage generator of claim 7, wherein the second charging circuit is configured to charge the difference voltage in the MOS capacitor by providing a current path from the second node to the ground voltage during the second phase when the second pulse signal has a first logic level, and
the second charging circuit is configured to charge a voltage corresponding to 2*VREF (where VREF denotes the reference voltage) during the first phase when the second pulse signal has a second logic level opposite to the first logic level.

9. The boosted voltage generator of claim 8, wherein the switch circuit provides a voltage of the third node to the output node as the boosted voltage during the first phase.

10. The boosted voltage generator of claim 1, wherein the switch circuit comprises:
a first p-channel metal-oxide semiconductor (PMOS) transistor that has a source connected to the second node, a drain connected to the output node and a gate connected to the third node; and
a second PMOS transistor that has a source connected to the third node, a drain connected to the output node and a gate connected to the second node.

11. The boosted voltage generator of claim 10, wherein the switch circuit provides a voltage of the third node to the output node as the boosted voltage through the second PMOS transistor during the first phase and the switch circuit provides a voltage of the second node to the output node as the boosted voltage through the first PMOS transistor during the second phase.

12. A voltage generator of a resistive type memory device, the voltage generator comprising:
a pulse generator configured to generate a first pulse signal and a second pulse signal based on a clock signal, the first pulse signal and the second pulse signal having a phase difference of 180 degree with respect to each other;
a reference voltage generator configured to generate a reference voltage having a level based on a trim signal; and
a boosted voltage generator configured to generate a boosted voltage following a target level, based on the first pulse signal, the second pulse signal, the reference voltage and a power supply voltage,
wherein the boosted voltage generator comprises:
a difference voltage generator configured to generate a difference voltage to a first node, based on the reference voltage and the power supply voltage;
a first charging circuit, connected between the first node and a ground voltage, configured to charge the difference voltage therein during a first phase in response to the first pulse signal;
a second charging circuit, connected between the first node and the ground voltage, configured to charge the difference voltage therein during a second phase in response to the second pulse signal; and
a switch circuit connected to a second node in the first charging circuit, a third node in the second charging circuit and an output node, and the switch circuit configured to provide the boosted voltage to the output node during each of the first phase and the second phase.

13. The voltage generator of claim 12, wherein the difference voltage generator outputs a voltage corresponding to 2*VREF−VDDC (where VREF denotes the reference voltage and the VDDC denotes the power supply voltage),
wherein the target level corresponds to 2*VREF,
wherein the trim signal includes a plurality of bits, and
wherein the reference voltage generator is configured to generate the reference voltage having a plurality of voltage levels according to bit values of the trim signal.

14. The voltage generator of claim 12, wherein the first charging circuit is configured to charge the difference voltage to a first a metal-oxide semiconductor (MOS) capacitor therein by providing a current path from the first node to the ground voltage during the first phase when the first pulse signal has a first logic level, and
the first charging circuit is configured to charge a voltage corresponding to 2*VREF (where VREF denotes the reference voltage) during the second phase when the first pulse signal has a second logic level opposite to the first logic level.

15. The voltage generator of claim 14, wherein the second charging circuit is configured to charge the difference voltage to a second MOS capacitor therein by providing a second current path from the first node to the ground voltage during the second phase when the second pulse signal has the first logic level, and
the second charging circuit is configured to charge a voltage corresponding to 2*VREF during the first phase when the second pulse signal has the second logic level.

16. A boosted voltage generator of a memory device, the boosted voltage generator comprising:
a difference voltage generator configured to generate a first voltage at a first node based on a reference voltage;
a first circuit including a first capacitor having a first end connected to a second node, the first circuit configured to charge the second node to the first voltage and boost the first voltage of the second node in response to a first pulse signal;
a second circuit including a second capacitor having a first end connected to a third node, the second circuit configured to charge the third node to the first voltage and boost the first voltage of the third node in response to a second pulse signal having an opposite phase as the first pulse signal; and
a switch circuit connected to the second node of the first circuit and the third node of the second circuit, the switch circuit configured to provide the boosted voltage to an output node.

17. The boosted voltage generator of claim 16, wherein the first circuit is configured to charge the second node to the first voltage when a voltage of the third node is boosted, and
wherein the second circuit is configured to charge the third node to the first voltage when a voltage of the second node is boosted.

18. The boosted voltage generator of claim 16, wherein the difference voltage generator includes a first input terminal for receiving the reference voltage, a second input terminal for receiving a power supply voltage, and an output terminal connected to the first node.

19. The boosted voltage generator of claim 16,
wherein the first circuit further includes:
a first transistor having a drain connected to the first node, a source connected to the second node, and a gate receiving the first pulse signal; and
a first inverter having an input terminal connected to the first pulse signal and an output terminal connected to a second end of the first capacitor, wherein the second circuit further includes:
a second transistor having a drain connected to the first node, a source connected to the third node, and a gate receiving the second pulse signal; and
a second inverter having an input terminal connected to the second pulse signal and an output terminal connected to a second end of the second capacitor.

20. The boosted voltage generator of claim 16, wherein the boosted voltage generator is configured to generate the boosted voltage including a variable voltage level based on the reference voltage.

* * * * *